United States Patent
Kobayashi

(10) Patent No.: US 8,409,995 B2
(45) Date of Patent: Apr. 2, 2013

(54) SUBSTRATE PROCESSING APPARATUS, POSITIONING METHOD AND FOCUS RING INSTALLATION METHOD

(75) Inventor: Yoshiyuki Kobayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 352 days.

(21) Appl. No.: 12/850,812

(22) Filed: Aug. 5, 2010

(65) Prior Publication Data

US 2011/0031111 A1    Feb. 10, 2011

Related U.S. Application Data

(60) Provisional application No. 61/242,568, filed on Sep. 15, 2009, provisional application No. 61/360,694, filed on Jul. 1, 2010.

(30) Foreign Application Priority Data

Aug. 7, 2009 (JP) ................................. 2009-183970
Jun. 10, 2010 (JP) ................................. 2010-133049

(51) Int. Cl.
  *H01L 21/302* (2006.01)
  *B44C 1/22* (2006.01)
  *C23F 1/00* (2006.01)

(52) U.S. Cl. ............ 438/715; 438/710; 216/59; 216/67; 156/345.43; 156/345.47; 156/345.51; 118/723 E; 118/725; 118/728

(58) Field of Classification Search .................... 216/59, 216/67; 438/710, 715; 156/345.43–345.47; 118/725, 728, 723 E See application file for complete search history.

(56) References Cited

U.S. PATENT DOCUMENTS

| | | | |
|---|---|---|---|
| 6,364,954 B2 * | 4/2002 | Umotoy et al. | 118/715 |
| 2006/0075969 A1 * | 4/2006 | Fischer | 118/725 |
| 2006/0156988 A1 * | 7/2006 | Wu et al. | 118/728 |
| 2010/0020463 A1 * | 1/2010 | Nasman et al. | 361/234 |

FOREIGN PATENT DOCUMENTS

| | | |
|---|---|---|
| JP | 10-265977 A | 10/1998 |
| JP | 2005-033062 A | 2/2005 |
| JP | 2006-196691 A | 7/2006 |

* cited by examiner

*Primary Examiner* — Shamim Ahmed
(74) *Attorney, Agent, or Firm* — Pearne & Gordon LLP

(57) ABSTRACT

Positioning accuracy of a component in a substrate processing apparatus can be improved higher than a conventional case without increasing the insertion accuracy of positioning pins into positioning holes. Provided is a substrate processing apparatus including a mounting table 110 including a susceptor 114 having a substrate mounting surface 115 on which a wafer W is mounted and a focus ring mounting surface 116 on which a focus ring 124 is mounted; a plurality of positioning pins 200 made of a material expandable in a diametric direction by heating. Each positioning pin is inserted into a positioning hole (first reference hole) formed in the focus ring mounting surface of the susceptor and into a positioning hole (second reference hole) formed in the focus ring, and expanded in the diametric direction by heating and fitted into the positioning holes, thus allowing a position of the focus ring to be aligned.

7 Claims, 20 Drawing Sheets

SUBSTRATE PROCESSING APPARATUS, POSITIONING METHOD AND FOCUS RING INSTALLATION METHOD

CROSS-REFERENCE TO RELATED APPLICATION

This application claims the benefit of U.S. Provisional Application Ser. No. 61/242,568 filed on Sep. 15, 2009, Japanese Patent Application No. 2009-183970 filed on Aug. 7, 2009, U.S. Provisional Application Ser. No. 61/360,694 filed on Jul. 1, 2010 and Japanese Patent Application No. 2010-133049 filed on Jun. 10, 2009, the entire disclosures of which are incorporated herein by reference.

FIELD OF THE INVENTION

The present disclosure relates to a substrate processing apparatus that processes a substrate such as a semiconductor wafer, a FPD (Flat Panel Display) substrate or a solar cell substrate and also relates to a method for positioning and installing a component such as a focus ring for use in the substrate processing apparatus.

BACKGROUND OF THE INVENTION

In a manufacturing process of a semiconductor device, a plasma etching process is repetitively performed to form a fine circuit pattern on a substrate such as a semiconductor wafer. In the plasma etching process, for example, plasma is generated by applying a high frequency voltage between facing electrodes in an evacuable processing chamber of a plasma processing apparatus. The plasma acts on the substrate mounted on a mounting table, and, thus, etching is carried out.

In order to perform a uniform and effective plasma process on a peripheral portion of the substrate as well as on a central portion thereof during the plasma etching process, a focus ring is provided on the mounting table so as to surround the substrate on the mounting table, and the etching is performed under such a configuration (see, for example, Patent Document 1).

In such a plasma processing apparatus, in order to perform a uniform and effective plasma process along a circumferential direction of the peripheral portion of the substrate, positioning holes are formed in a contact surface of the mounting table and the focus ring and then positioning pins are inserted into the positioning holes. In such a case, there is a need for increasing the insertion accuracy, i.e., narrowing a gap between the positioning holes and the positioning pins in a diametric direction when the focus ring is positioned. In this case, as the insertion accuracy improves, positioning accuracy of the focus ring can also be ameliorated.

Patent Document 1: Japanese Patent Laid-open Publication No. 2005-33062

Patent Document 2: Japanese Patent Laid-open Publication No. H10-265977

Since, however, the focus ring is exposed to the plasma of high temperature equal to or higher than several hundreds of degrees, a position deviation may be caused between the components such as the mounting table and the focus ring made of different materials due to a difference in thermal expansion amounts of these components. For the reason, as the insertion of the positioning pins into the position holes is increased, a greater force is applied to the positioning pins or the focus ring when the focus ring is deviated from the mounting table due to the difference in their thermal expansion amounts, resulting in damage on the positioning pins or the focus ring.

Conventionally, therefore, a heat resistant material (e.g., polyimide) hardly suffering thermal deformation under a high heat condition has been preferred as a material for the positioning pins. Further, it has been attempted to loosen the insertion accuracy of the positioning pins into the positioning holes in consideration of the thermal expansion of the mounting table or the focus ring.

However, as the insertion accuracy is loosened, the gap between the positioning holes and the positioning pins in the diametric direction increases, and, thus, there is a likelihood that the focus ring may be deviated from its original position. If the focus ring is deviated, a gap between an outer peripheral surface of the substrate and an inner peripheral surface of the focus ring may become non-uniform along a circumferential direction of the substrate. Thus, a substrate temperature may also become non-uniform along the circumferential direction of the peripheral portion of the substrate, resulting in a failure to maintain uniformity of the process.

As discussed above, components provided in the substrate processing apparatus are exposed to high heat of the plasma. Thus, when the positions of the components are aligned by inserting positioning pins into positioning holes, e.g., when the positions of other components such as an electrode plate of an upper electrode (see, for example, Patent Document 2) as well as the mounting table and the focus ring are aligned, there has been a limit in improving positioning accuracy between the components by increasing the insertion accuracy between the components.

BRIEF SUMMARY OF THE INVENTION

In view of the foregoing, the present disclosure provides a substrate processing apparatus capable of improving positioning accuracy of a second component (e.g., a focus ring or an electrode plate) with respect to a first component (e.g., a susceptor or an electrode support) without increasing the insertion accuracy of positioning pins into positioning holes.

In accordance with one aspect of the present disclosure, there is provided a substrate processing apparatus for performing a plasma process on a substrate accommodated in a processing chamber and surrounded by a focus ring. The apparatus includes a mounting table including a susceptor having a substrate mounting surface on which the substrate is mounted and a focus ring mounting surface on which the focus ring is mounted; and a plurality of positioning pins made of a material expandable in a diametric direction by heating. Each positioning pin is inserted into a positioning hole formed in the focus ring mounting surface of the susceptor and into a positioning hole formed in the focus ring, and each positioning pin is expanded in the diametric direction by heating and fitted into the positioning holes, thus allowing a position of the focus ring to be aligned.

In accordance with another aspect of the present disclosure, there is provided a substrate processing apparatus for performing a plasma process on a substrate accommodated in a processing chamber. The substrate processing apparatus includes a mounting table including a susceptor having a substrate mounting surface on which the substrate is mounted; an upper electrode facing the susceptor and having an electrode plate to which a high frequency power for generating plasma is applied and an electrode support supporting the electrode plate; and a plurality of positioning pins made of a material expandable in a diametric direction by heating. Each positioning pin is inserted into a positioning hole formed in the electrode support and into a positioning hole formed in the electrode plate, and each positioning pin is expanded in the diametric direction by heating and fitted into the positioning holes, thus allowing a position of the electrode plate to be aligned.

In this configuration, even if there is a gap between the positioning pin before heating and the positioning holes in the diametric direction, the positioning pin is expanded in the diametric direction by heating, and, thus, the gap is filled up. Accordingly, centers of the positioning holes can be accurately aligned on a substantially same line just by heating the positioning pin without increasing the insertion accuracy of the positioning pin into the positioning holes. Thus, the focus ring can be accurately positioned at a preset position with respect to the susceptor.

In accordance with still another aspect of the present disclosure, there is provided a method for positioning a focus ring in a substrate processing apparatus that performs a plasma process on a substrate mounted on a mounting table in a processing chamber and surrounded by the focus ring. The mounting table includes a susceptor having a substrate mounting surface on which the substrate is mounted and a focus ring mounting surface on which the focus ring is mounted, and a plurality of positioning pins made of a material expandable in a diametric direction by heating. Each positioning pin is inserted into a positioning hole formed in the focus ring mounting surface of the susceptor and into a positioning hole formed in the focus ring. Further, the method includes heating each positioning pin and allowing the positioning pin to be expanded so as to fill a gap within the positioning holes in a diametric direction and to be fitted into the positioning holes; and allowing centers of the positioning holes to be aligned on a substantially same line, and thus allowing the focus ring to be positioned at a preset position with respect to the susceptor.

In accordance with still another aspect of the present disclosure, there is provided a method for positioning an electrode plate of a plasma processing apparatus that performs a process on a substrate mounted on a mounting table by plasma generated by applying a high frequency power to an electrode plate provided on an upper electrode facing the mounting table. The upper electrode includes an electrode support that supports the electrode plate, and a plurality of positioning pins made of a material expandable in a diametric direction by heating. Each positioning pin is inserted into a positioning hole formed in the electrode support and into a positioning hole formed in the electrode plate. Further, the method includes heating each positioning pin and allowing the positioning pin to be expanded so as to fill a gap within the positioning holes in a diametric direction and to be fitted into the positioning holes; and allowing centers of the positioning holes to be aligned on a substantially same line, and thus allowing the electrode plate to be positioned at a preset position with respect to the electrode support.

In this method, even if there is a gap between the positioning pin before heating and the positioning holes in the diametric direction, the positioning pin is expanded in the diametric direction by heating, and, thus, the gap is filled up. Accordingly, centers of the positioning holes can be accurately aligned on a substantially same line just by heating the positioning pin without increasing the insertion accuracy of the positioning pin into the positioning holes. Thus, the electrode plate can be exactly positioned at a preset position with respect to the electrode support.

In accordance with still another aspect of the present disclosure, there is provided a substrate processing apparatus for performing a plasma process on a substrate accommodated in a processing chamber and surrounded by a focus ring. The apparatus includes a mounting table including a susceptor having a substrate mounting surface on which the substrate is mounted and a focus ring mounting surface on which the focus ring is mounted; a plurality of positioning pins made of a material expandable in a diametric direction by heating, each positioning pin being provided in the focus ring so as to be protruded from a bottom surface of the focus ring, inserted into a positioning hole formed in the focus ring mounting surface of the susceptor, expanded in the diametric direction by heating, and fitted into the positioning hole, thus allowing a position of the focus ring to be aligned; first lifter pins provided in the mounting table so as to be protruded above or be retracted below the substrate mounting surface and configured to lift up the substrate and separate the substrate from the substrate mounting surface; second lifter pins provided in the mounting table so as to be protruded above or be retracted from the focus ring mounting surface and configured to lift up the focus ring together with the positioning pins and separate the focus ring from the focus ring mounting surface; and a transfer arm provided outside the processing chamber and configured to exchange the substrate with the first lifter pins via a loading/unloading port provided at the processing chamber, and configured to exchange the focus ring equipped with the positioning pins with the second lifter pins.

In accordance with still another aspect of the present disclosure, there is provided a method of installing a focus ring so as to surround a substrate accommodated in a processing chamber of a substrate processing apparatus that performs a plasma process on the substrate. The substrate processing apparatus includes a mounting table including a susceptor having a substrate mounting surface on which the substrate is mounted and a focus ring mounting surface on which the focus ring is mounted; a susceptor temperature controller that controls a temperature of the susceptor; a plurality of positioning pins made of a material expandable in a diametric direction by heating, each positioning pin being inserted into the focus ring so as to be protruded from a bottom surface thereof and inserted into a positioning hole formed in the focus ring mounting surface of the susceptor; first lifter pins provided in the mounting table so as to be protruded above or retracted below the substrate mounting surface and configured to lift up the substrate and separate the substrate from the substrate mounting surface; second lifter pins provided in the mounting table so as to be protruded above or retracted from the focus ring mounting surface and configured to lift up the focus ring together with the positioning pins and separate the focus ring from the focus ring mounting surface; and a transfer arm provided outside the processing chamber, and configured to exchange the substrate with the first lifter pins via a loading/unloading port provided at the processing chamber, and configured to exchange the focus ring equipped with the positioning pins with the second lifter pins. Further, the method includes lifting up the focus ring equipped with the positioning pins by the second lifer pins to replace the focus ring; receiving the focus ring by the transfer arm and unloading the focus ring to an outside of the processing chamber through the loading/unloading port; transferring a new focus ring equipped with positioning pins before heating to the second lifter pins by the transfer arm; lowering the second lifter pins, and allowing the focus ring to be mounted on the focus ring mounting surface while the positioning pins are inserted into the positioning holes; and heating each of the positioning pins by heating the susceptor by the susceptor temperature controller, and allowing each of the positioning pins to be expanded in a diametric direction and aligning a position of the focus ring.

In accordance with the present disclosure, since the focus ring can be automatically placed on the focus ring mounting surface of the susceptor by the transfer arm, the focus ring can be replaced without opening the processing chamber to the atmosphere. Besides, since the focus ring equipped with the positioning pin can be transferred and replaced, accurate positioning can be carried out by heating the positioning pin when the focus ring is installed on the susceptor.

Accordingly, even when a position of the focus ring is deviated due to a transfer error of the transfer arm and, thus, there is a gap between the positioning pin before heating and the positioning holes in the diametric direction, the positioning hole is heated and expanded in the diametric direction and fitted into the positioning holes. Thus, the focus ring can be accurately positioned at a preset position with respect to the susceptor.

In accordance with the present disclosure, with respect to a first component (e.g., a susceptor or an electrode support), positioning accuracy of a second component (e.g., a focus ring or an electrode plate) can be improved higher than a conventional case without increasing the insertion accuracy of the positioning pins into positioning holes.

BRIEF DESCRIPTION OF THE DRAWINGS

The disclosure may best be understood by reference to the following description taken in conjunction with the following figures.

DETAILED DESCRIPTION OF THE INVENTION

Figure 1:
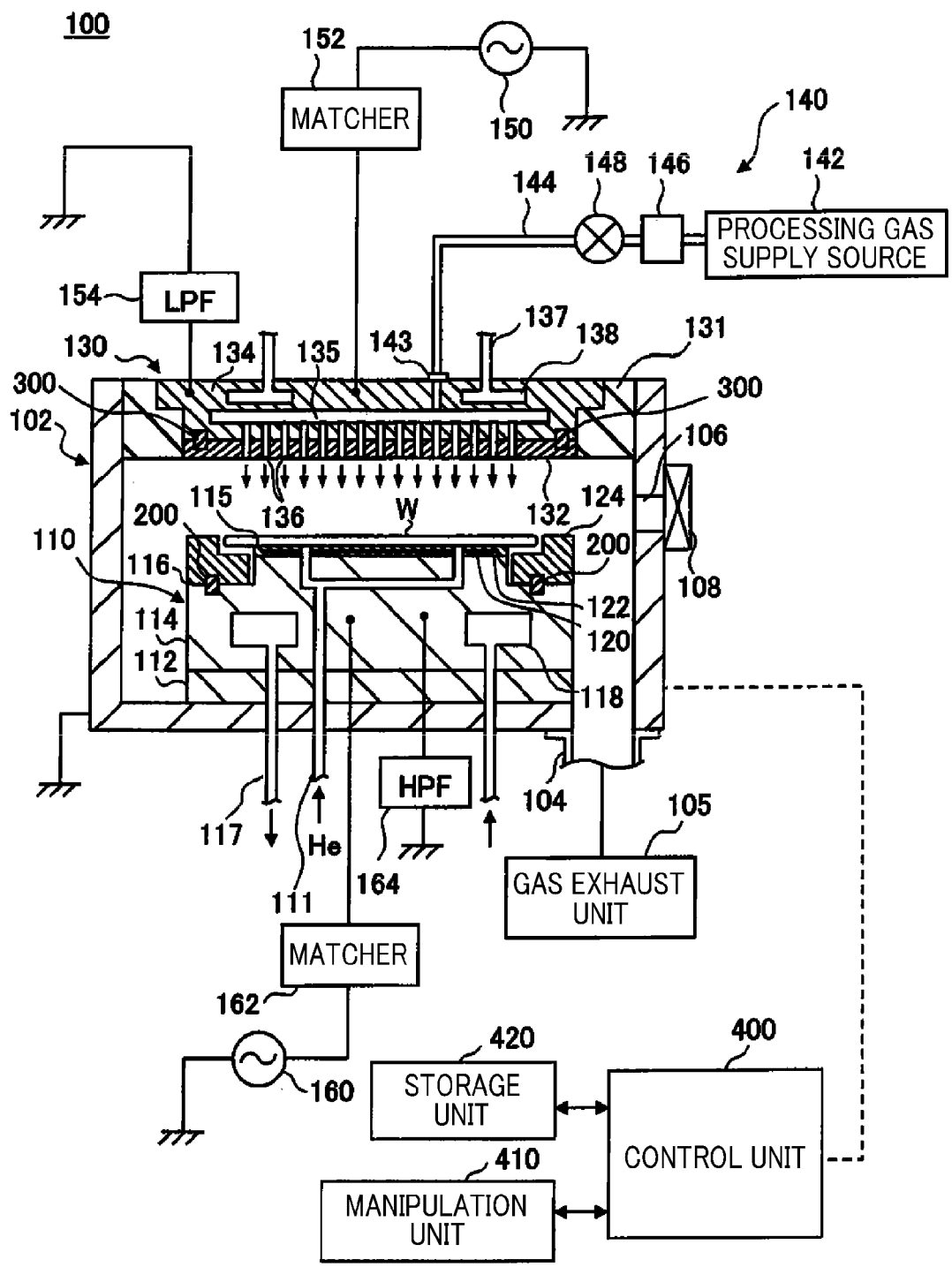
FIG. 1 is a longitudinal cross sectional view illustrating a schematic configuration of a plasma processing apparatus in accordance with a first embodiment of the present disclosure.

Hereinafter, embodiments of the present disclosure will be described in detail with reference to the accompanying drawings. Through the whole documents, parts having substantially same function and configuration will be assigned same reference numerals, and redundant description will be omitted.

First Embodiment

First, a schematic configuration of a substrate processing apparatus in accordance with a first embodiment of the present disclosure will be elaborated with reference to the relevant drawings. Here, the description will be provided for an example case of a plasma processing apparatus 100 of a single parallel plate type as a substrate processing apparatus. FIG. 1 is a longitudinal cross sectional view illustrating a schematic configuration of the plasma processing apparatus 100 in accordance with the first embodiment.

The plasma processing apparatus 100 includes a processing chamber 102 having a cylindrical processing vessel made of, e.g., aluminum of which surface is anodically oxidized (alumite treated). The processing chamber 102 is grounded. A substantially column-shaped mounting table 110 configured to mount a wafer W thereon is provided at a bottom of the processing chamber 102. The mounting table 110 includes a plate-shaped insulator 112 made of ceramic or the like and a susceptor 114 provided on the insulator 112 and configured as a lower electrode.

The mounting table 110 includes a susceptor temperature controller 117 capable of controlling the susceptor 114 to a preset temperature. For example, the susceptor temperature controller 117 is configured to circulate a temperature control medium through a temperature control medium room 118 provided within the susceptor 114.

The susceptor 114 has a protrusion serving as a substrate mounting portion at a central top portion thereof. A top surface of the substrate mounting portion is configured as a substrate mounting surface 115, and a top surface of a lower portion around the substrate mounting portion is configured as a focus ring mounting surface 116. In case that an electrostatic chuck 120 is provided on top of the substrate mounting portion, as shown in FIG. 1, a top surface of the electrostatic chuck 120 serves as the substrate mounting surface 115. The electrostatic chuck 120 includes an electrode 122 embedded in an insulating member. A DC voltage of, e.g., about 1.5 kV is applied to the electrostatic chuck 120 from a non-illustrated DC power supply connected with the electrode 122. Accordingly, the wafer W is electrostatically attracted to and held on the electrostatic chuck 120. The substrate mounting portion has a diameter smaller than a diameter of the wafer W. Thus, when the wafer W is mounted, a peripheral portion of the wafer W is protruded outward from the substrate mounting portion.

A focus ring 124 is provided on a periphery of the top portion of the susceptor 114 to surround the wafer W mounted on the substrate mounting surface 115 of the electrostatic chuck 120. The focus ring 124 is mounted on the focus ring mounting surface 116 of the susceptor 114 and the position of the focus ring 124 with respect to the susceptor 114 is aligned by positioning pins 200. A positioning method for the focus ring 124 will be elaborated later.

Formed through the insulator 112, the susceptor 114 and the electrostatic chuck 120 is a gas passage 111 through which a heat transfer medium (e.g., a backside gas such as a He gas) is supplied to a rear surface of the wafer W mounted on the substrate mounting surface 115. Heat is transferred between the susceptor 114 and the wafer W via the heat transfer medium, thus allowing the wafer W to be maintained at a preset temperature.

An upper electrode 130 is provided above the susceptor 114 so as to face the susceptor 114 in parallel. A space provided between the upper electrode 130 and the susceptor 114 becomes a plasma generation space. The upper electrode 130 is supported at a top portion of the processing chamber 102 via an insulating shield member 131.

The upper electrode 130 includes an electrode plate 132 and an electrode support 134 holding the electrode plate 132 detachably. The electrode plate 132 is made of, e.g., quartz, and the electrode support 134 is made of a conductive material such as aluminum of which surface is alumite treated. The position of the electrode plate 132 with respect to the electrode support 134 is aligned by positioning pins 300. A positioning method for the electrode plate 132 will be explained later.

Connected with the electrode support 134 is a processing gas supply unit 140 that introduces a processing gas into the processing chamber 102 from a processing gas supply source 142. The processing gas supply source 142 is connected to a gas inlet 143 of the electrode support 134 via a gas supply pipe 144.

As illustrated in FIG. 1, the gas supply pipe 144 is provided with a mass flow controller (MFC) 146 and an opening/closing valve 148 in sequence from an upstream side. A flow control system (FCS) may be used instead of the MFC. A fluorocarbon gas ($C_xF_y$) such as $C_4F_8$ gas is supplied as a processing gas for etching from the processing gas supply source 142.

The processing gas supply source 142 supplies, e.g., an etching gas for plasma etching. Further, although a single processing gas supply system including the gas supply pipe 144, the opening/closing valve 148 and the mass flow controller 146 and the processing gas supply source 142 is illustrated in FIG. 1, the plasma processing apparatus 100 may be provided with a plurality of processing gas supply systems. For example, etching gases such as $CF_4$, $O_2$, $N_2$ and $CHF_3$ may be supplied into the processing chamber 102 while their flow rates are controlled independently.

A gas diffusion space 135 having, e.g., a substantially cylindrical shape is provided in the electrode support 134 so as to uniformly diffuse the processing gas introduced from the gas supply pipe 144. A multiple number of gas discharge holes 136 are provided in a bottom portion of the electrode support 134 and through the electrode plate 132 so as to discharge the processing gas from the gas diffusion space 135 into the inside of the processing chamber 102. The processing gas diffused in the gas diffusion space 135 can be uniformly discharged toward the plasma generation space through the gas discharge holes 136. In this regard, the upper electrode 130 serves as a shower head for supplying the processing gas.

The upper electrode 130 includes an electrode support temperature controller 137 capable of controlling the electrode support 134 to a preset temperature. For example, the electrode support temperature controller 137 is configured to circulate a temperature control medium through a temperature control medium room 138 provided in the electrode support 134. Furthermore, although not shown, the mounting table 110 is provided with a lifter that lifts the wafer W upward by a lifter pin and separates the wafer W from the substrate mounting surface 115.

A gas exhaust pipe 104 is connected to a bottom of the processing chamber 102, and a gas exhaust unit 105 is connected with the gas exhaust pipe 104. The gas exhaust unit 105 includes a vacuum pump such as a turbo molecular pump and evacuates the inside of the processing chamber 102 to a preset depressurized level. Furthermore, a loading/unloading port 106 for the wafer W is provided in a sidewall of the processing chamber 102, and a gate valve 108 is provided at the loading/unloading port 106. The wafer W is loaded and unloaded through the loading/unloading port 106 by a non-illustrated transfer arm or the like.

The upper electrode 130 is connected with a first high frequency power supply 150 via a first matcher 152. The first high frequency power supply 150 is capable of outputting a high frequency power for plasma generation in a frequency range from about 50 MHz to about 150 MHz. High-density plasma in a desirable dissociation state can be generated within the processing chamber 102 by applying the power in such a high frequency range to the upper electrode 130, and, thus, a plasma process can be carried out under a lower pressure condition. Desirably, the frequency of the output power of the first high frequency power supply 150 is in the range of about 50 MHz to about 80 MHz, and, typically, it is set to about 60 MHz.

The susceptor 114 serving as a lower electrode is connected with a second high frequency power supply 160 via a second matcher 162. The second high frequency power supply 160 is capable of outputting a high frequency bias power of a frequency higher than about several hundreds of kHz and lower than about 20 MHz. Typically, the frequency of the output power of the second high frequency power supply 160 is set to, e.g., about 2 MHz or about 13.56 MHz.

Further, the susceptor 114 is also connected with a high pass filter (HPF) 164 that filters a high frequency current introduced into the susceptor 114 from the second high frequency power supply 160. Meanwhile, the upper electrode 130 is connected with a low pass filter (LPF) 154 that filters a high frequency current introduced into the upper electrode 130 from the first high frequency power supply 150.

A control unit (overall control device) 400 is connected with the plasma processing apparatus 100. Each component of the plasma processing apparatus 100 is controlled by the control unit 400. Further, the control unit 400 is connected with a manipulation unit 410 including a keyboard through which an operator inputs a command to manage the plasma processing apparatus 100 and a display on which an operational status of the plasma processing apparatus 100 is visualized and displayed.

Further, the control unit 400 is also connected with a storage unit 420 that stores therein: programs for implementing various kinds of processes (e.g., a plasma process on the wafer W, an stabilizing process for the chamber state to be described later, and so forth) performed in the plasma processing apparatus 100 under the control of the control unit 400; and processing conditions (recipes) necessary for executing the programs.

A plurality of processing conditions (recipes) is stored in the storage unit 420. These processing conditions include control parameters for controlling each component of the plasma processing apparatus 100, setup parameters, and so forth. For example, each processing condition may have parameter values such as a flow rate ratio of processing gases, an internal pressure of the processing chamber and high frequency powers.

Further, these programs or processing conditions may be stored in a hard disk or a semiconductor memory, or they may be set in a preset position of the storage unit 420 in the form of a computer-readable portable storage medium such as a CD-ROM or a DVD.

The control unit 400 reads out a program and processing condition from the storage unit 420 in response to an instruction from the manipulation unit 410 or the like and controls each component, thereby carrying out a desired process in the plasma processing apparatus 100. Further, the processing condition can be edited by the manipulation unit 410.

(Positioning of the Focus Ring)

Here, positioning of the focus ring 124 as an example of a second component with respect to the susceptor 114 as an example of a first component will be described. As shown in FIG. 1, the positions of the susceptor 114 and the focus ring 124 are aligned by a plurality of (e.g., two or three) positioning pins 200 provided on their contact surfaces.

Figure 2A:
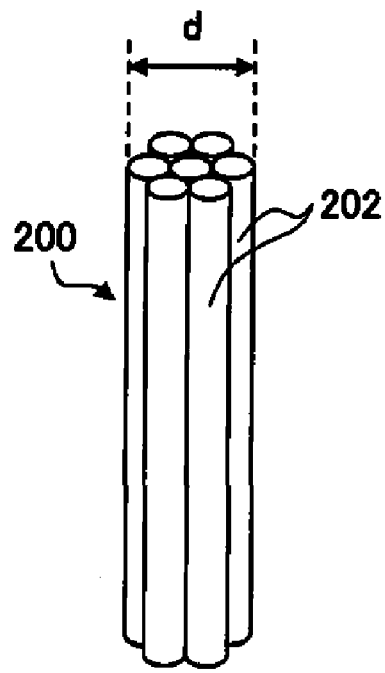
FIG. 2A is a schematic diagram illustrating a configuration of a positioning pin in accordance with the first embodiment, and it shows a state before the positioning pin is heated.
Figure 2B:
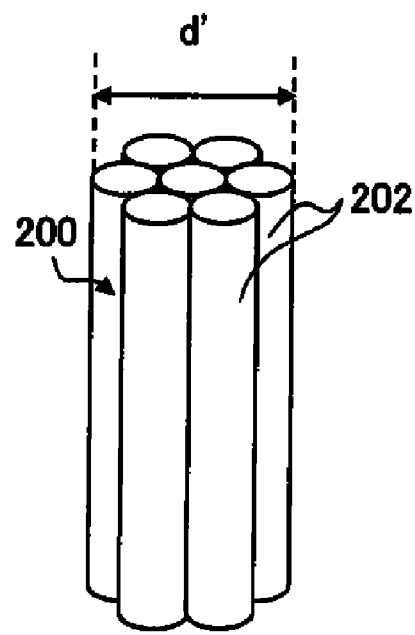
FIG. 2B is a schematic diagram illustrating a configuration of the positioning pin in accordance with the first embodiment, and it shows a state after the positioning pin is heated.

The positioning pins 200 used in the present embodiment are made of a material expandable in a diametric direction when heated to or higher than a preset temperature. Such a material may be, e.g., polyphenylene sulfide (PPS) resin or polyethyleneterephthalate (PET) resin. For example, the PPS resin includes a bunch of PPS fibers 202, as illustrated in FIG. 2A. In the present embodiment, each positioning pin 200 is made of this PPS resin. The positioning pin 200 made of the PPS resin expands in a diametric direction and contracts in a vertical direction, as shown in FIG. 2B, when it is heated to or higher than a preset temperature (e.g., about 100° C.). FIGS. 2A and 2B provide simplified enlarged views of the PPS fibers 202 to describe a structure of the positioning pin 200 and a change in diameter of the positioning pin 200, and only some of the PPS fibers 202 are illustrated for the simplicity of illustration in FIGS. 2A and 2B.

Figure 3A:
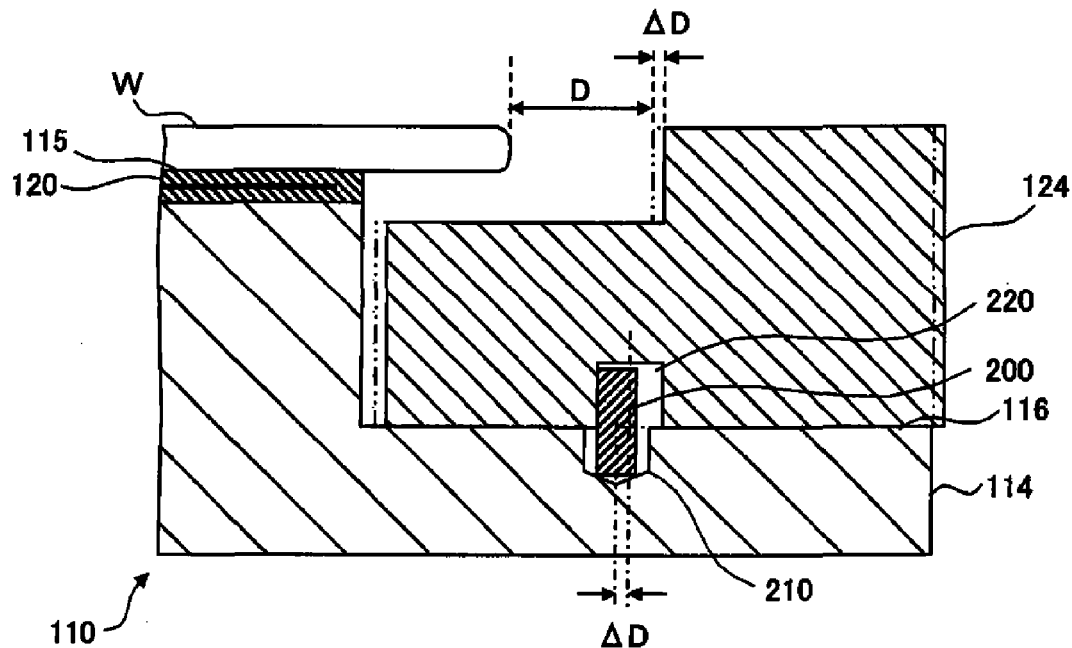
FIG. 3A is a schematic diagram for describing an operation of positioning a focus ring in accordance with the first embodiment of the present disclosure, and it shows a state after a positioning pin before heating is inserted.

Now, a method for positioning the focus ring 124 by using characteristics of the positioning pin 200 having the above-described configuration will be explained. For example, positioning of the focus ring 124 may be performed during assembly of the apparatus or replacement of the focus ring 124 for the maintenance thereof. To elaborate, as shown in FIG. 3A, when the focus ring 124 is installed on the susceptor 114, a positioning pin 200 before heating is inserted into a positioning hole (first reference hole) 210 and a positioning hole (second reference hole) 220 in a movable state. The positioning holes 210 and 220 are formed in a contact surface, i.e., the focus ring mounting surface 116 of the susceptor 114 and in the bottom surface of the focus ring 124, respectively. Here, each diameter of the positioning hole 210 and 220 is designed to be larger than a diameter of the positioning pin 200.

Then, the positioning pin 200 is heated to or higher than a preset temperature. In the plasma processing apparatus 100 shown in FIG. 1, the positioning pin 200 can be heated by heating the susceptor 114 to or higher than the preset temperature by the susceptor temperature controller 117. Here, the positioning pin 200 is heated to or higher than a temperature at which it is expanded in the diametric direction. Thus, the necessary temperature varies depending on the material of the positioning pin 200. For example, when the positioning pin 200 is made of the PPS resin, it may be heated to or higher than about 80° C. to about 100° C.

Figure 3B:
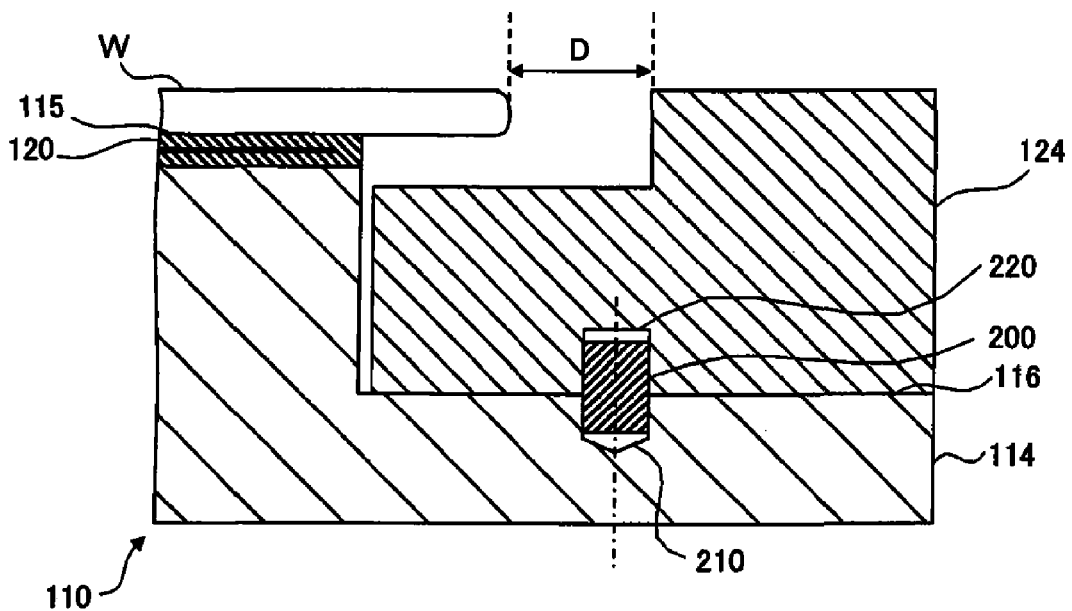
FIG. 3B is a schematic diagram for describing an operation of positioning the focus ring in accordance with the first embodiment of the present disclosure, and it shows a state after the positioning pin of FIG. 3A is heated.

As the positioning pin 200 is heated, the positioning pin 200 is expanded in the diametric position, and, thus, a gap within the positioning hole 210 or 220 in the diametric direction is filled up, as illustrated in FIG. 3B. Accordingly, a position deviation (ΔD shown in FIG. 3A) between centers of the positioning holes 210 and 220 is removed, so that their centers can be aligned on a substantially same central line. In this way, the focus ring 124 can be accurately positioned at a preset position on the susceptor 114 without deviation. As a result, a gap D between an outer periphery of the wafer W and the focus ring 124 becomes uniform along an entire circumferential direction, and, thus, intra-surface uniformity of the plasma process on the wafer W (especially, intra-surface uniformity at a peripheral portion of the wafer W along the circumferential direction) can be improved.

In the above, although the description has been provided for the case of heating the positioning pin 200 by heating the susceptor 114 to or higher than the preset temperature by the susceptor temperature controller 117, heating mechanism for the positioning pin 200 is not limited thereto.

For example, after the assembly or the maintenance of the apparatus, a stabilizing process for the chamber state (e.g., a seasoning process) for adjusting an internal state of the processing chamber 102 may be performed prior to a plasma process on a product wafer. In the stabilizing process for the chamber state, a plasma process is performed under the same processing condition as that for a product wafer, for example. At this time, the focus ring 124 and the susceptor 114 are heated by heat applied from plasma generated within the processing chamber 102. Accordingly, since the positioning pin 200 is heated to or higher than the preset temperature, a process of heating the susceptor 114 to or higher than the preset temperature by the susceptor temperature controller 117 can be omitted.

In this case, heating temperatures for the focus ring 124 and the susceptor 114 may be different depending on processing conditions, and, thus, the positioning pin 200 may not be heated to or higher than the preset temperature. Accordingly, it may be desirable to determine whether or not the positioning pin 200 is heated to the preset temperature based on the processing conditions and then, based on the determination result, to determine whether to heat the susceptor 114 to or equal to the preset temperature by the susceptor temperature controller 117.

Here, the stabilizing process for the chamber state will be described with reference to a flowchart shown in FIG. 4, for example. In step S110, it is determined whether to heat the positioning pin 200 by the susceptor temperature controller 117. In this case, data regarding whether to perform the heating of the positioning pin 200 is previously stored in the storage unit 420 for each of a plurality of processing conditions, and the determination is carried out based on the data related to the processing condition for performing a plasma process according to the stabilizing process for the chamber state.

For example, as the data regarding whether to perform the heating, data indicating that there is a need for heating by the susceptor temperature controller 117 may be stored in relation to a processing condition under which the positioning pin 200 is not heated to or higher than the preset temperature even by the heat from the plasma. On the other hand, data indicating that there is no need for heating by the susceptor temperature controller 117 may be stored in relation to a processing condition under which the positioning pin 200 is sufficiently heated to or higher than the preset temperature by the heat applied from the plasma.

When it is determined in step S120 that the heating of the positioning pin 200 by the susceptor temperature controller 117 is necessary, the susceptor 114 is heated to or higher than the preset temperature by the susceptor temperature controller 117, thereby heating the positioning pin 200 in step S130. As a result, the positioning pin 200 is expanded in the diametric direction, so that the focusing ring 124 can be accurately positioned. Then, in step S140, the plasma process for stabilizing the internal state of the processing chamber 102 is carried out.

On the other hand, if it is determined in step S120 that the heating of the positioning pin 200 by the susceptor temperature controller 117 is not necessary, the plasma process for stabilizing the internal state of the processing chamber 102 is performed in step S140 without heating the susceptor 114 by the susceptor temperature controller 117. The positioning pin 200 is heated by heat applied from plasma generated within the processing chamber 102 at this time. As a result, the positioning pin 200 is expanded in the diametric direction, so that the focus ring 124 can be positioned accurately.

Since, however, the susceptor 114 and the focus ring 124 are made of different materials, their thermal expansion coefficients are also different. For example, the susceptor 114 may be made of aluminum of which surface is alumite treated, whereas the focus ring 124 may be made of silicon which is the same as a material of the wafer W. In such a case, the susceptor 114 has a higher thermal expansion coefficient than that of the focus ring 124. Thus, when these two components are heated, the susceptor 114 exhibits a larger thermal expansion amount than that of the focus ring 124.

Even in such a case, a difference in their thermal expansion amounts can be absorbed because diameters of the positioning holes 210 and 220 can be set to be larger than a diameter of the positioning pin 200 before heating. That is, even if positions of the positioning holes 210 and 220 are deviated because of a change in diameters of the susceptor 114 and the focus ring 124 when they are heated by the susceptor temperature controller 117 or by the heat applied from the plasma, the positioning pin 200 is expanded in the diametric direction when it is heated, thereby absorbing a position deviation amount of the positioning holes 210 and 220 and allowing the centers of the positioning holes 210 and 220 to be aligned on the substantially same line.

Accordingly, even if there is a difference in the thermal expansion amounts of the susceptor 114 and the focus ring 124, the focus ring 124 can be accurately positioned by adjusting the diameters of the positioning holes 210 and 220 based on such a difference.

Figure 5:
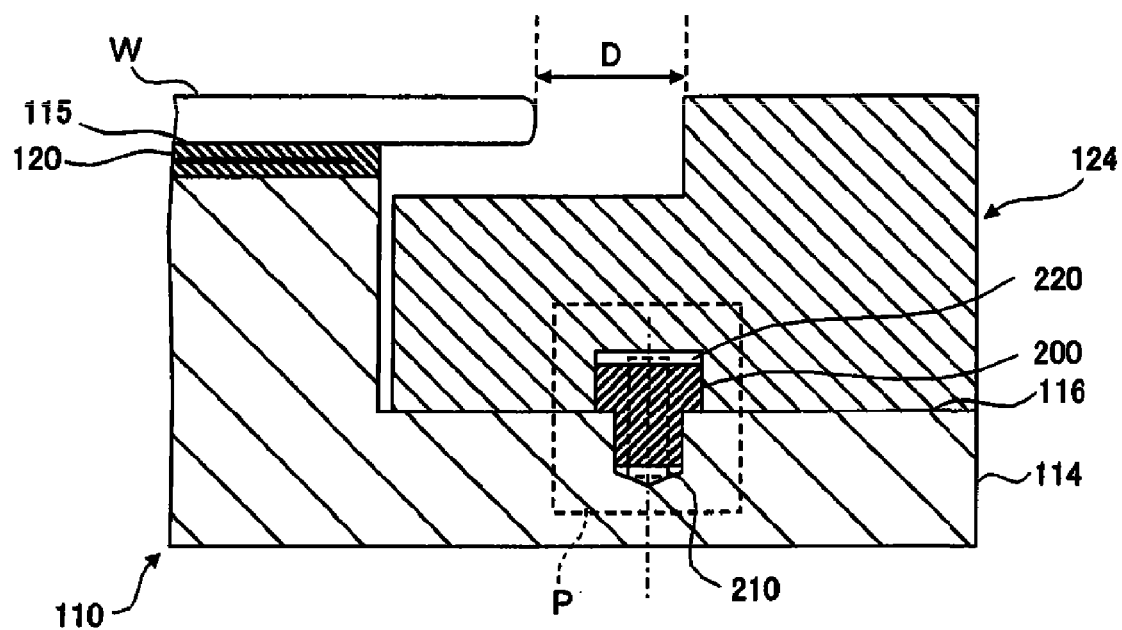
FIG. 5 is a schematic diagram illustrating a modification example of a positioning hole (second reference hole) of the focus ring in accordance with the first embodiment of the present disclosure.

In such a case, it may be desirable to set the diameter of the positioning hole 220 of the focus ring 124 to be larger than the diameter of the positioning hole 210 of the susceptor 114, as illustrated in FIG. 5. With this configuration, even if there is a great difference in the thermal expansion amounts of the susceptor 114 and the focus ring 124, the difference can be absorbed and the focus ring 124 can be accurately positioned.

Figure 6A:
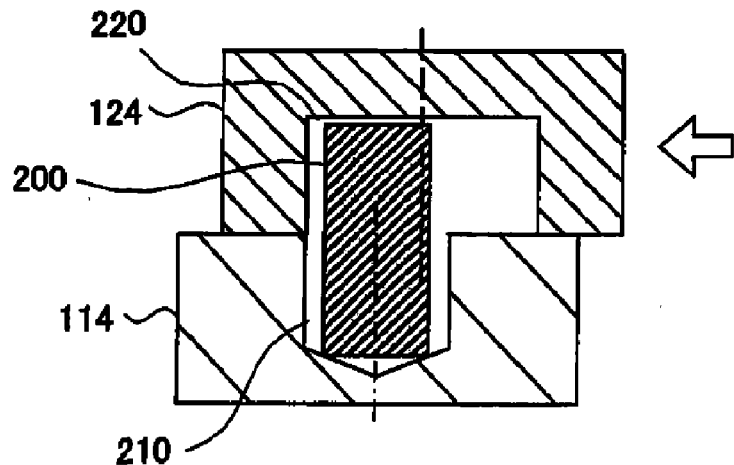
FIG. 6A is a schematic diagram for describing an operation of positioning the focus ring shown FIG. 5, and it shows a state after a positioning pin before heating is inserted.
Figure 6B:
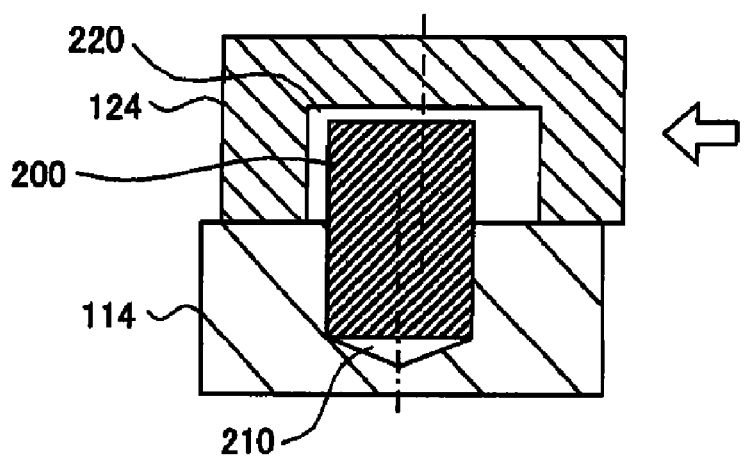
FIG. 6B is a schematic diagram for describing an operation of positioning the focus ring shown in FIG. 5, and it shows a state during heating of the positioning pin of FIG. 6A.
Figure 6C:
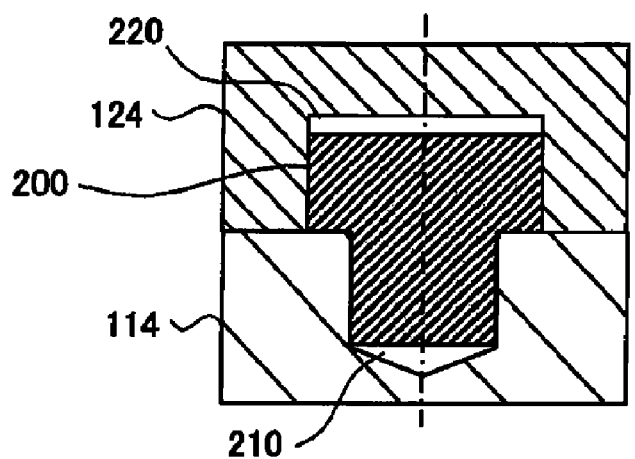
FIG. 6C is a schematic diagram for describing an operation of positioning the focus ring shown in FIG. 5, and it shows a state after the positioning pin of FIG. 6A is heated.

FIGS. 6A to 6C are schematic diagrams for describing an operation of positioning the focus ring 124 by inserting the positioning pin 200 into the positioning holes 210 and 220 shown in FIG. 5. FIGS. 6A to 6C provide enlarged views of a part P in FIG. 5. First, as illustrated in FIG. 6A, if the positioning pin 200 is heated to or higher than the preset temperature after the positioning pin 200 is inserted into the positioning holes 210 and 220, the positioning pin 200 is gradually expanded in the diametric direction. Then, the positioning pin 200 fills up a gap of the positioning hole 210, as illustrated in FIG. 6B, and, then, it fills up a gap of the positioning hole 220 as illustrated in FIG. 6C. As a consequence, the centers of the positioning holes 210 and 220 are aligned on the substantially same line, and the focus ring 124 can be accurately positioned.

In accordance with the first embodiment as discussed above, if the positioning pin 200 is expanded in the diametric direction by heating, the gaps between the positioning holes 210 and 220 and the positioning pin 200 are filled up. Thus, the focus ring 124 can be positioned with respect to the susceptor 114 with higher accuracy than in conventional cases without increasing the insertion accuracy of the positioning pin 200 into the positioning holes 210 and 220.

(Positioning of the Electrode Plate)

Now, positioning of the electrode plate 132 as an example of a second component with respect to the electrode support 134 as an example of a first component will be described. As shown in FIG. 1, the positions of the electrode support 134 and the electrode 132 are aligned by a plurality of (e.g., two or three) positioning pins 300 provided in their contact surfaces. Here, since the positioning pins 300 are made of the same material as that of the positioning pins 200 and have the same characteristics, detailed description thereof will be omitted herein.

Figure 7A:
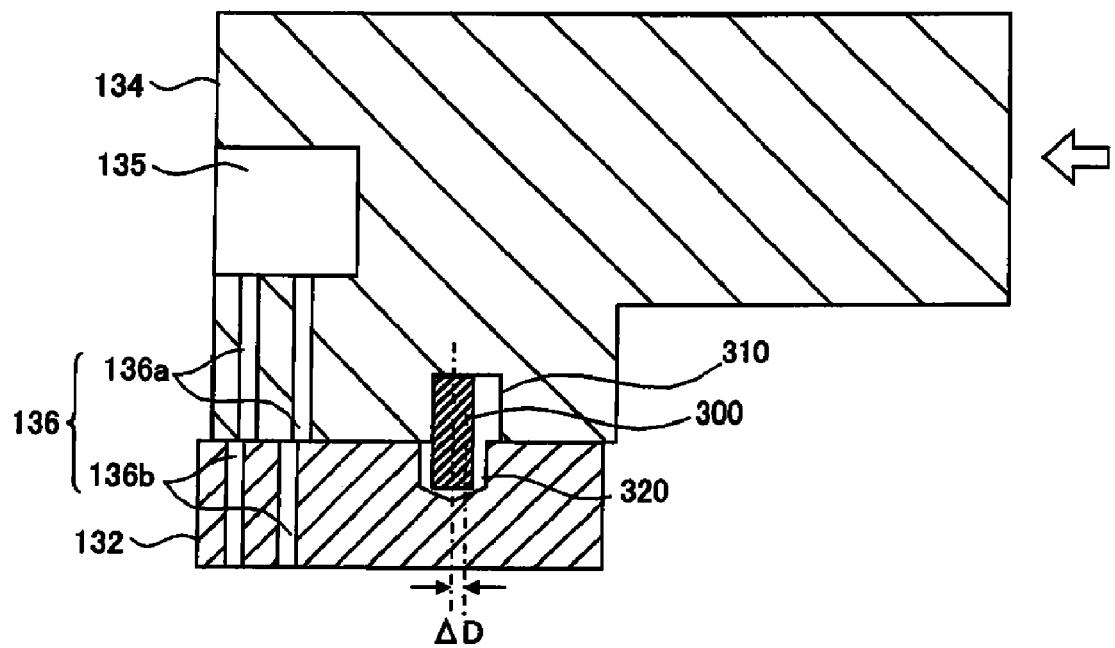
FIG. 7A is a schematic diagram for describing an operation of positioning an electrode plate in accordance with the first embodiment, and it shows a state after a positioning pin before heating is inserted.

Hereinafter, a method for positioning the electrode plate 132 by using the characteristics of the positioning pins 300 will be explained. For example, positioning of the electrode plate 132 may be performed during assembly of the apparatus or replacement of the electrode plate 132 for the maintenance thereof. To elaborate, as shown in FIG. 7A, when the electrode plate 132 is installed under the electrode support 134, a positioning pin 300 before heating is inserted into a positioning hole (first reference hole) 310 and a positioning hole (second reference hole) 320 in a movable state. The positioning holes 310 and 320 are formed in a contract surface, i.e., a bottom surface of the electrode support 134 and in a top surface of the electrode plate 132, respectively. Here, each diameter of the positioning holes 310 and 320 is designed to be larger than a diameter of the positioning pin 300.

Then, the positioning pin 300 is heated to or higher than a preset temperature. In the plasma processing apparatus 100 shown in FIG. 1, the positioning pin 300 can be heated by heating the electrode support 134 to or higher than the preset temperature by the electrode support temperature controller 137. Here, the positioning pin 300 is heated to or higher than a temperature at which it is expanded in the diametric direction. Thus, the necessary temperature varies depending on the material of the positioning pin 300. For example, when the positioning pin 300 is made of the PPS resin as in the case of the positioning pin 200, it is heated to or higher than about 100° C.

Figure 7B:
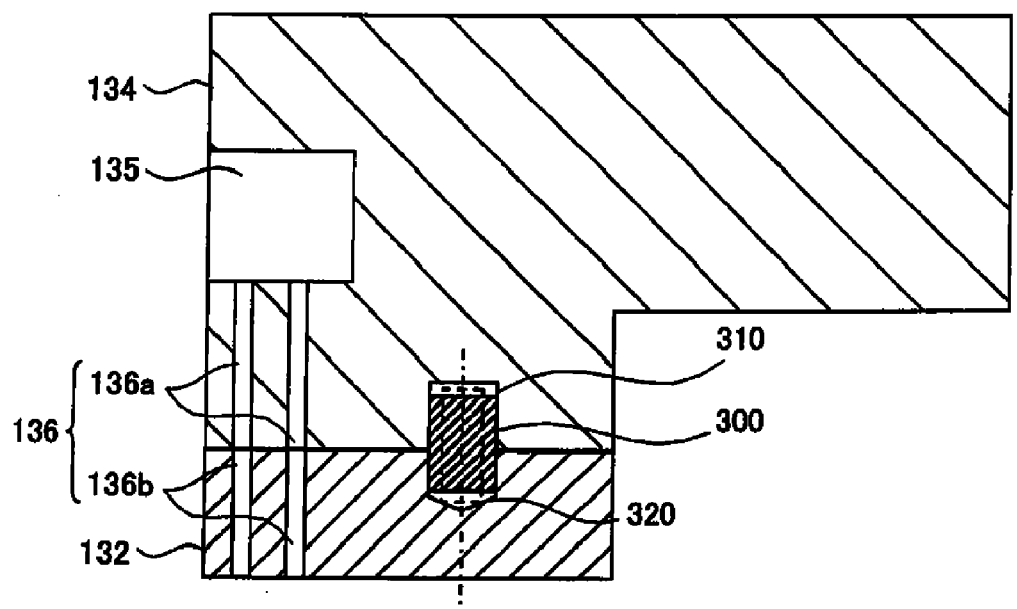
FIG. 7B is a schematic diagram for describing an operation of positioning the electrode plate in accordance with the first embodiment, and it shows a state after the positioning pin of FIG. 7A is heated.

Accordingly, a gap within the positioning holes 310 or 320 in the diametric direction is filled up, as illustrated in FIG. 7B. Thus, a position deviation (ΔD shown in FIG. 7A) between centers of the positioning holes 310 and 320 is removed, and their centers can be aligned on a substantially same central line. In this way, the electrode plate 132 can be accurately positioned at a preset position under the electrode support 134 without deviation. With this configuration, since gas discharge holes 136a of the electrode support 134 and gas discharge holes 136b of the electrode plate 132 are not deviated, reduction of conductance can be avoided and leakage of the processing gas between the electrode support 134 and the electrode plate 132 through the gas discharge holes 136a can be prevented.

In the above, although the description has been provided for the case of heating the positioning pin 300 by heating the electrode support 134 to or higher than the preset temperature by the electrode plate temperature controller 137, heating mechanism for the positioning pin 300 is not limited thereof. As described above, the electrode support 134 and the electrode plate 132 may be heated by heat applied from plasma generated within the processing chamber 102 during the stabilizing process for the chamber state. Accordingly, since the positioning pin 300 is heated to or higher than the preset temperature, a process of heating the electrode support 134 to or higher than the preset temperature by the electrode support temperature controller 137 can be omitted.

In this case, heating temperatures for the electrode plate 132 and the electrode support 134 may be different depending on processing conditions, and, thus, the positioning pin 300 may not be heated to or higher than the preset temperature. Accordingly, it may be desirable to determine whether or not the positioning pin 300 is heated to the preset temperature based on the processing conditions and then, based on the determination result, to determine whether to heat the electrode support 134 to or equal to the preset temperature by the electrode support temperature controller 137. At this time, the stabilizing process for the chamber state described in FIG. 4 may be carried out, for example.

Figure 4:
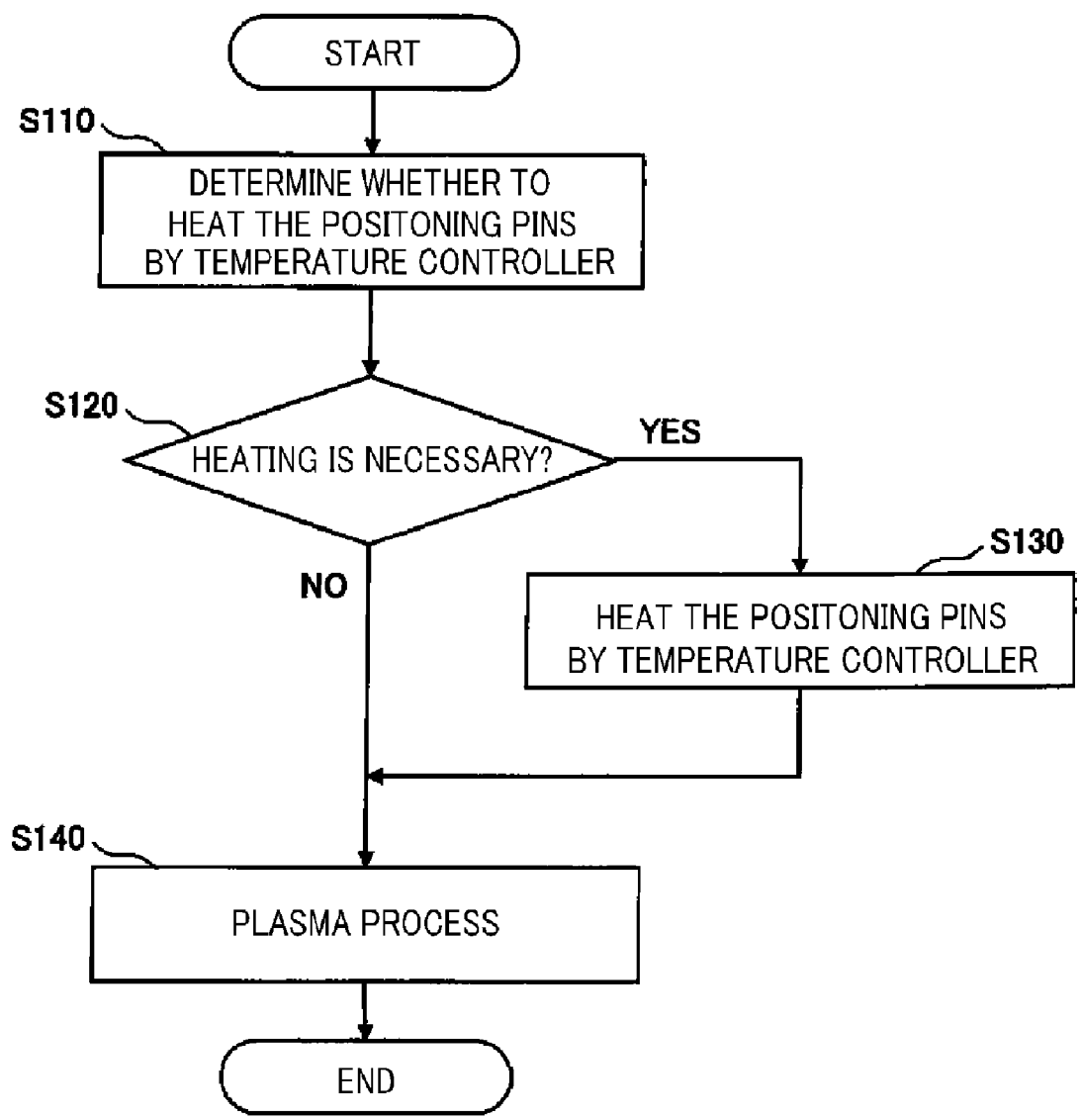
FIG. 4 is a flowchart for describing an example process for stabilizing an internal state of a processing chamber in accordance with the first embodiment of the present disclosure.

To elaborate, in step S110 shown in FIG. 4, it is determined whether to heat the positioning pin 300 by the electrode support temperature controller 137. In this case, data regarding whether to perform the heating of the positioning pin 300 is previously stored in the storage unit 420 for each of a plurality of processing conditions, and the determination is carried out based on the data related to the processing condition for performing a plasma process according to the stabilizing process for the chamber state.

For example, as the data regarding whether to perform the heating, data indicating that there is a need for the heating by the electrode support temperature controller 137 may be stored in relation to a processing condition under which the positioning pin 300 is not heated to or higher than the preset temperature even by the heat from the plasma. On the other hand, data indicating that there is no need for heating by the electrode support temperature controller 137 may be stored in relation to a processing condition under which the positioning pin 300 is sufficiently heated to or higher than the preset temperature by the heat applied from the plasma.

When it is determined in step S120 that the heating of the positioning pin 300 by the electrode support temperature controller 137 is necessary, the electrode support 134 is heated to or higher than the preset temperature by the electrode support temperature controller 137, thereby heating the positioning pin 300 in step 130. As a result, the positioning pin 300 is expanded in the diametric direction, so that the electrode plate 132 can be accurately positioned. Then, in step S140, the plasma process for stabilizing the internal state of the processing chamber 102 is carried out.

On the other hand, if it is determined in step S120 that the heating of the positioning pin 300 by the electrode support temperature controller 137 is not necessary, the plasma process for stabilizing the internal state of the processing chamber 102 is performed in step S140 without heating the electrode support 134 by the electrode support controller 137. The positioning pin 300 is heated by the heat applied from the plasma generated within the processing chamber 102 at this time. As a result, the positioning pin 300 is expanded in the diametric direction, so that the electrode plate 132 can be positioned accurately.

Since, however, the electrode support 134 and the electrode plate 132 are made of different materials, their thermal expansion coefficients are also different. For example, the electrode support 134 may be made of aluminum of which surface is alumite treated, whereas the electrode plate 132 is made of quartz or the like. In such a case, as in the relationship between the susceptor 114 and the focus ring 124, the electrode support 134 has a higher thermal expansion coefficient than that of the electrode plate 132. Thus, when these two components are heated, the electrode support 134 exhibits a larger thermal expansion amount than that of the electrode plate 132.

Even in such a case, a difference in their thermal expansion amounts can be absorbed because diameters of the positioning holes 310 and 320 can be set to be larger than a diameter of the positioning pin 300 before heating. That is, even if positions of the positioning holes 310 and 320 are deviated because of a change in diameters of the electrode support 134 and the electrode plate 132 when they are heated by the electrode support controller 137 or by the heat applied from the plasma, the positioning pin 300 is expanded in the diametric direction when it is heated, thereby absorbing a position deviation amount of the positioning holes 310 and 320 and allowing the centers of the positioning holes 310 and 320 to be aligned on the substantially same line. Accordingly, even if there is a difference in the thermal expansion amounts of the electrode support 134 and the electrode plate 132, the electrode plate 132 can be accurately positioned by adjusting the diameters of the positioning holes 310 and 320 based on such a difference.

Figure 8:
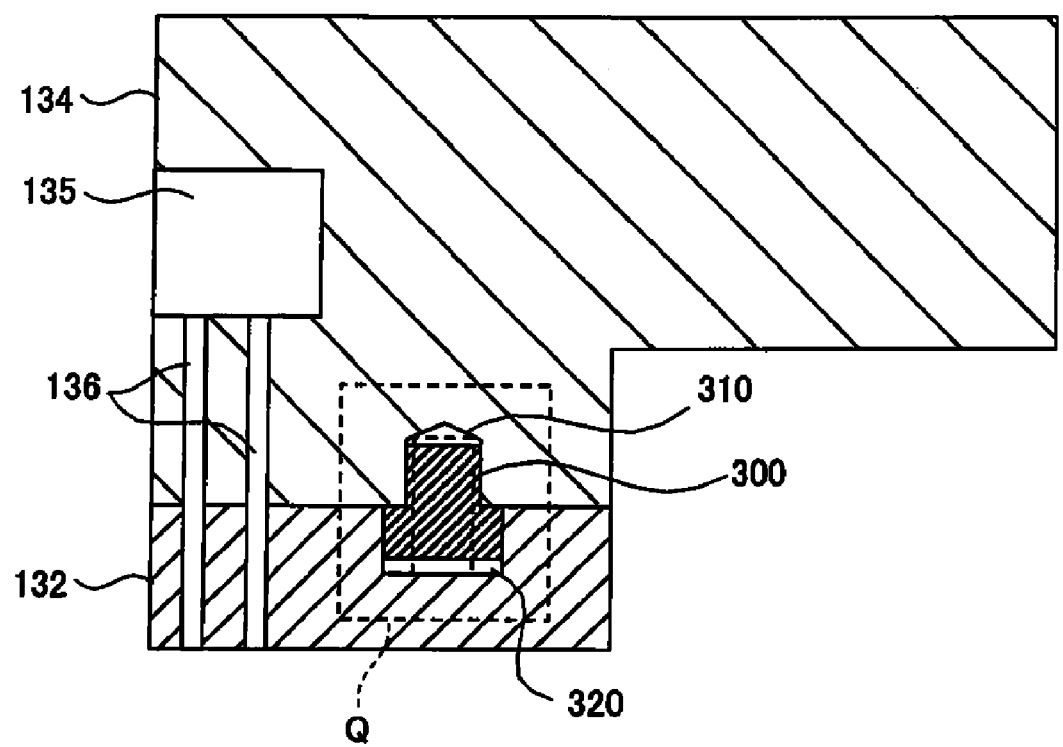
FIG. 8 is a schematic diagram illustrating a modification example of a positioning hole (first reference hole) of the electrode plate in accordance with the first embodiment.

In such a case, it may be desirable to set the diameter of the positioning hole 320 of the electrode plate 132 to be larger than the diameter of the positioning hole 310 of the electrode support 134, as shown in FIG. 8. With this configuration, even if there is a great difference in the thermal expansion amounts of the electrode support 134 and the electrode plate 132, the difference can be absorbed and the electrode plate 132 can be accurately positioned.

Figure 9A:
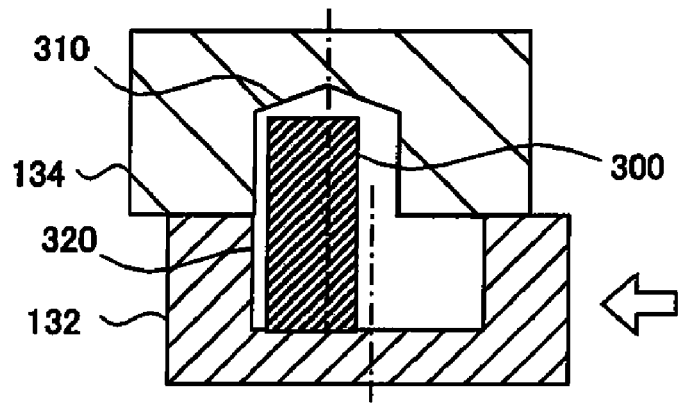
FIG. 9A is a schematic diagram for describing an operation of positioning the electrode plate shown in FIG. 8, and it shows a state after a positioning pin before heating is inserted.
Figure 9B:
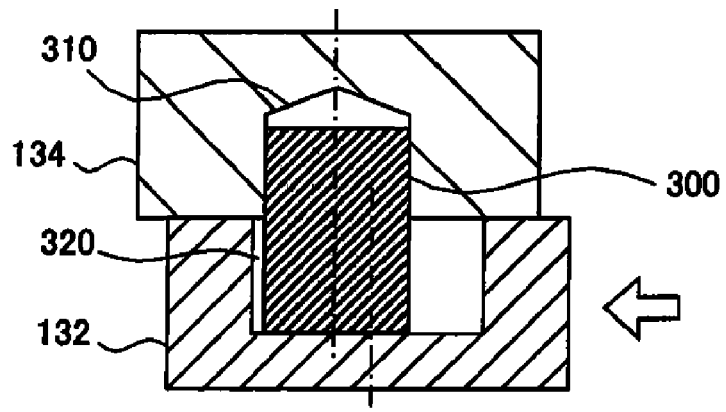
FIG. 9B is a schematic diagram for describing an operation of positioning the electrode plate shown in FIG. 8, and it shows a state during heating of the positioning pin of FIG. 9A.
Figure 9C:
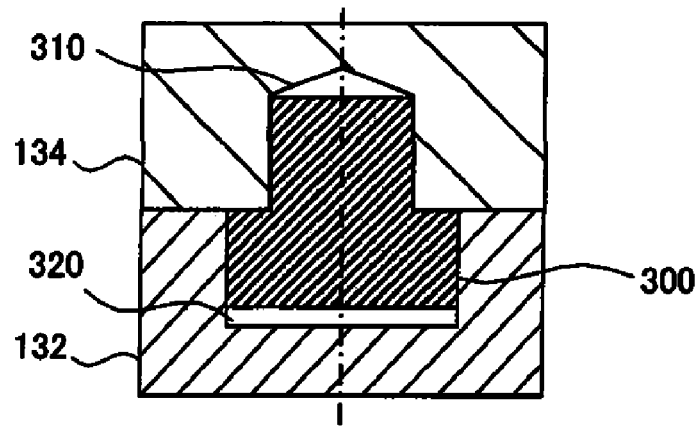
FIG. 9C is a schematic diagram for describing an operation of positioning the electrode plate shown in FIG. 8, and it shows a state after the positioning pin of FIG. 9A is heated.

FIGS. 9A to 9C are schematic diagrams for describing an operation of positioning the electrode plate 132 by inserting the positioning pin 300 into the positioning holes 310 and 320 shown in FIG. 8. FIGS. 9A to 9C provide enlarged views of a part Q in FIG. 8. First, as illustrated in FIG. 9A, if the positioning pin 300 is heated to or higher than the preset temperature after the positioning pin 300 is inserted into the positioning holes 310 and 320, the positioning pin 300 is gradually expanded in the diametric direction. Then, the positioning pin 300 fills up a gap of the positioning hole 310, as illustrated in FIG. 9B, and, then, it fills up a gap of the positioning hole 320 as illustrated in FIG. 9C. As a consequence, the centers of the positioning holes 310 and 320 are aligned on the substantially same line, and the electrode plate 132 can be accurately positioned.

The positioning hole 310 of the electrode support 134 may have a diameter or a shape capable of holding the positioning pin 300 while preventing the positioning pin 300 from falling down when the positioning pin 300 before heating is inserted into the positioning hole 310. With this configuration, when the positioning pin 300 is inserted in a movable state, the positioning pin 300 is first inserted into and held by the positioning hole 310 of the electrode support 134, and the electrode plate 132 can be installed.

Figure 10:
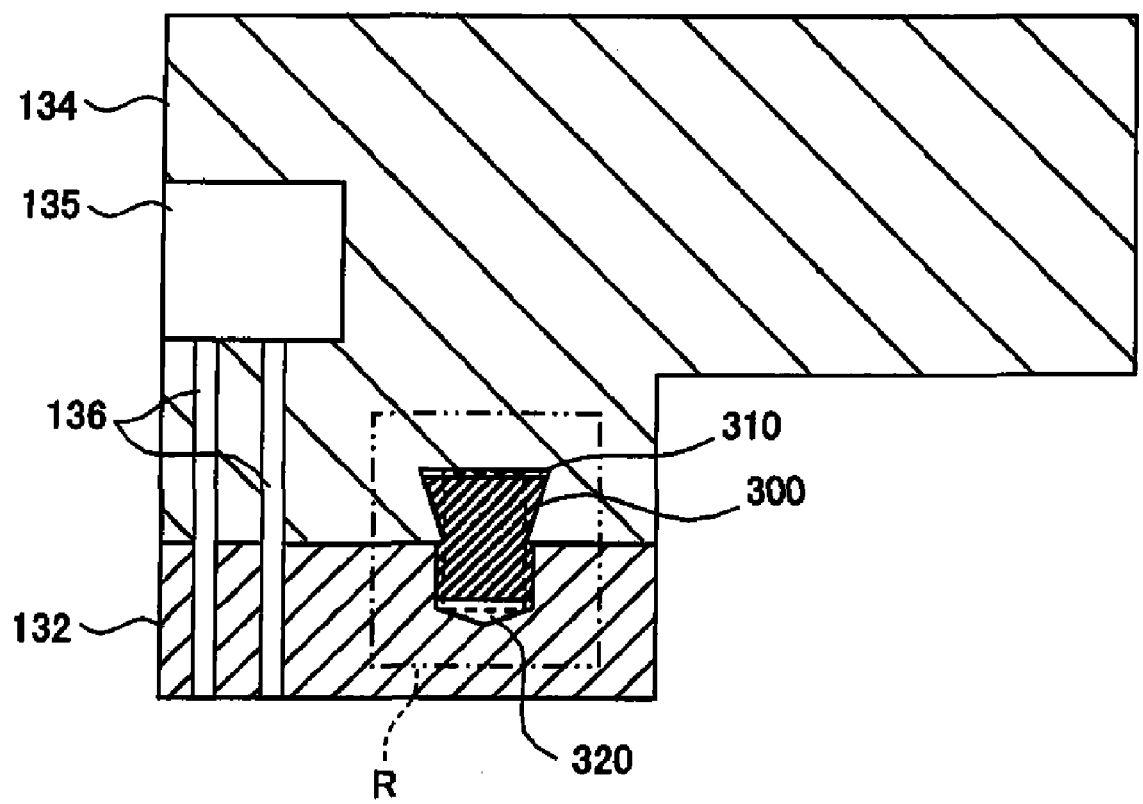
FIG. 10 is a schematic diagram illustrating a modification example of a positioning hole (first reference hole) of an electrode support in accordance with the first embodiment.

For example, as illustrated in FIG. 10, the positioning hole 310 of the electrode support 134 may be formed in a tapered shape having a smaller diameter in a downward direction. Here, a bottommost portion of the positioning hole 310 is set to have a diameter capable of holding the positioning pin 300 while preventing the positioning pin 300 from falling down when it is inserted.

Figure 11A:
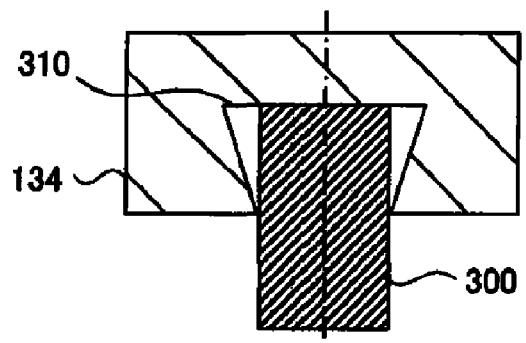
FIG. 11A is a schematic diagram for describing an operation of positioning an electrode plate shown in FIG. 10, and it shows a state after a positioning pin before heating is inserted into the reference hole of the electrode support.

FIGS. 11A to 11E are schematic diagrams for describing an operation of positioning the electrode plate 132 by inserting the positioning pin 300 into the positioning holes 310 and 320 shown in FIG. 10. FIGS. 11A to 11E provide enlarged views of a part R shown in FIG. 10. First, as illustrated in FIG. 11A, the positioning pin 300 before heating is inserted into the positioning hole 310 such that a lower end portion of the positioning pin 300 is protruded from the positioning hole 310. At this time, since the positioning pin 300 is held by the bottommost portion of the positioning hole 310 having the smallest diameter, the positioning pin 300 can be prevented from falling down.

Figure 11B:
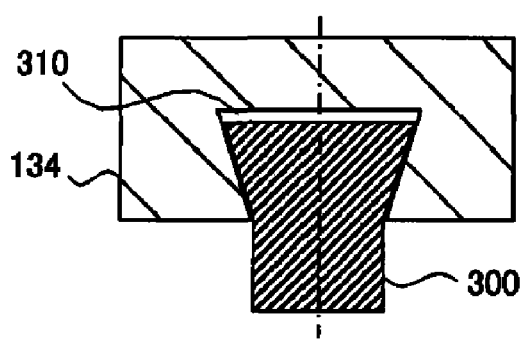
FIG. 11B is a schematic diagram for describing an operation of positioning the electrode plate shown in FIG. 10, and it shows a state after the positioning pin of FIG. 11A is heated.

In this state, if the electrode support 134 is heated by the electrode support temperature controller 137, the positioning pin 300 is expanded so as to be fitted into the shape of the positioning hole 310, as illustrated in FIG. 11B. Here, the positioning pin 300's portion protruding from the positioning hole 310 may be covered with a heat insulating member so as not to be expanded. In this way, the positioning pin 300 is firmly accommodated in the positioning hole 310. Further, if the positioning pin 300 can be held in the positioning hole 310 firmly enough so as not to fall down just by being inserted into the positioning hole 310, the heating process can be omitted.

Figure 11C:
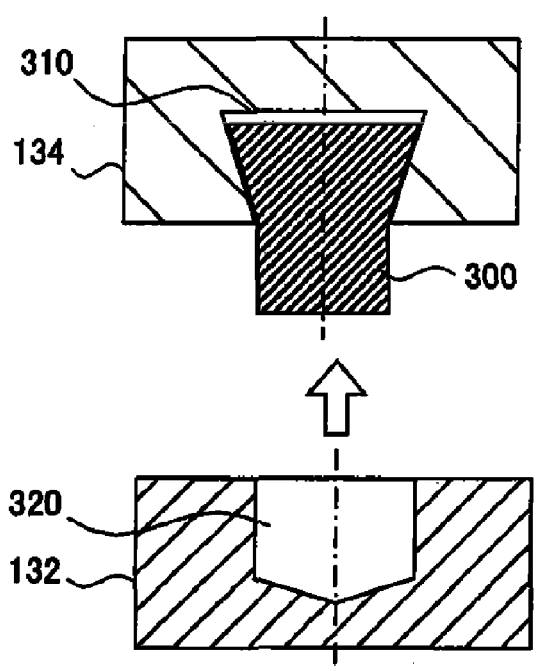
FIG. 11C is a schematic diagram for describing an operation of positioning the electrode plate shown in FIG. 10, and it shows a state during the insertion of the positioning hole of FIG. 11B into the reference hole of the electrode plate.
Figure 11D:
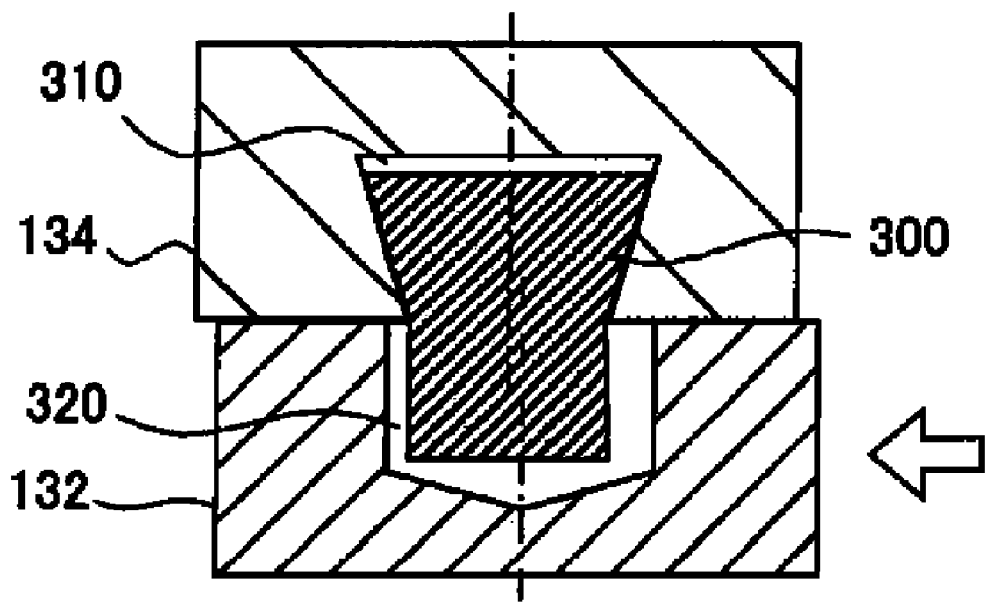
FIG. 11D is a schematic diagram for describing an operation of positioning the electrode plate shown in FIG. 10, and it shows a state after the positioning pin of FIG. 11B is inserted into the reference hole of the electrode plate.
Figure 11E:
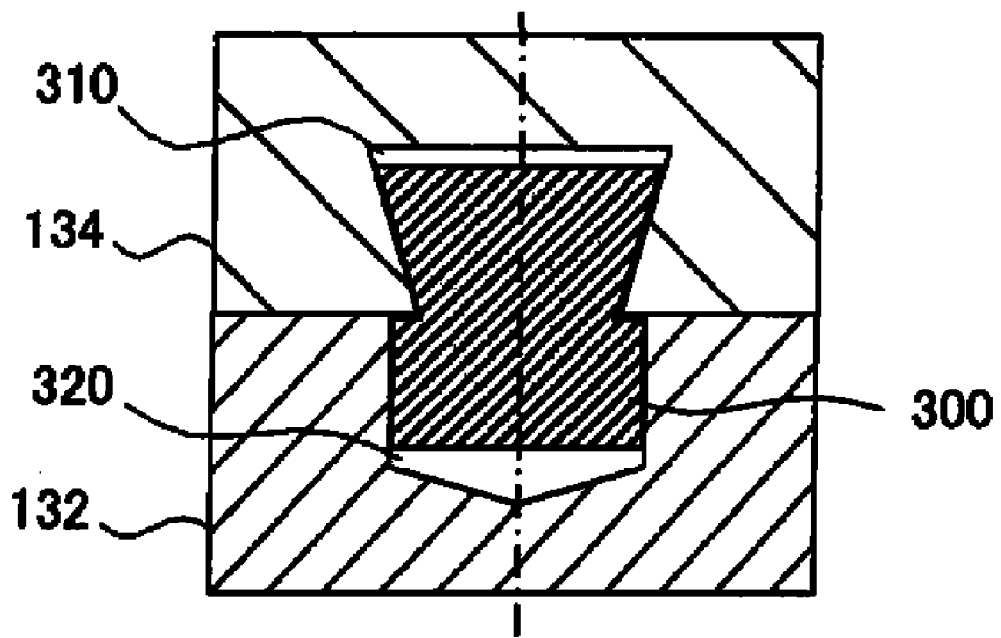
FIG. 11E is a schematic diagram for describing an operation of positioning the electrode plate shown in FIG. 10, and it shows a state after the positioning pin of FIG. 11D is heated.

Subsequently, as illustrated in FIGS. 11C and 11D, the electrode plate 132 is installed such that a head portion of the positioning pin 300 protruded downward from the positioning hole 310 is accommodated in the positioning hole 320. Then, if the positioning pin 300 is heated to or higher than the preset temperature by the electrode support temperature controller 137 or the heat applied from the plasma, the positioning pin 300 is gradually expanded in the diametric direction, thereby filling up a gap of the positioning hole 320, as illustrated in FIG. 11E. Accordingly, the centers of the positioning holes 310 and 320 can be aligned on the substantially same line, so that the electrode plate 132 can be positioned accurately.

In accordance with the first embodiment as discussed above, if the positioning pin 300 is expanded in the diametric direction by heating, the gaps between the positioning holes 310 and 320 and the positioning pin 300 are filled up. Thus, the electrode plate 132 can be positioned with respect to the electrode support 134 with higher accuracy than in conventional cases without increasing the insertion accuracy of the positioning pin 300 into the positioning holes 310 and 320.

Although the present embodiment has been described for the case of using the temperature controller 117 and 137 to heat the positioning pins 200 and 300 in addition to the heat applied from plasma, the present disclosure is not limited thereto. For example, if heaters are provided in the susceptor 114 and in the electrode support 134, respectively, the positioning pins 200 and 300 may be heated by these heaters.

Furthermore, in the above-described embodiment, although the positioning of the focus ring 124 by using the positioning pin 200 and the positioning of the electrode plate 132 of the upper electrode 130 by using the positioning pin 300 have been both carried out, positioning of only one of them may be performed. Moreover, the focus ring 124 which is to be aligned by the positioning pin 200 may be manually placed on the focus ring mounting surface 116 by an operator after opening a cover of the processing chamber 102 (opening the chamber to the atmosphere) or may be automatically placed on the focus ring mounting surface 116 by a non-illustrated transfer arm without opening the cover of the processing chamber 102 (without opening the chamber to the atmosphere).

Second Embodiment

Figure 12:
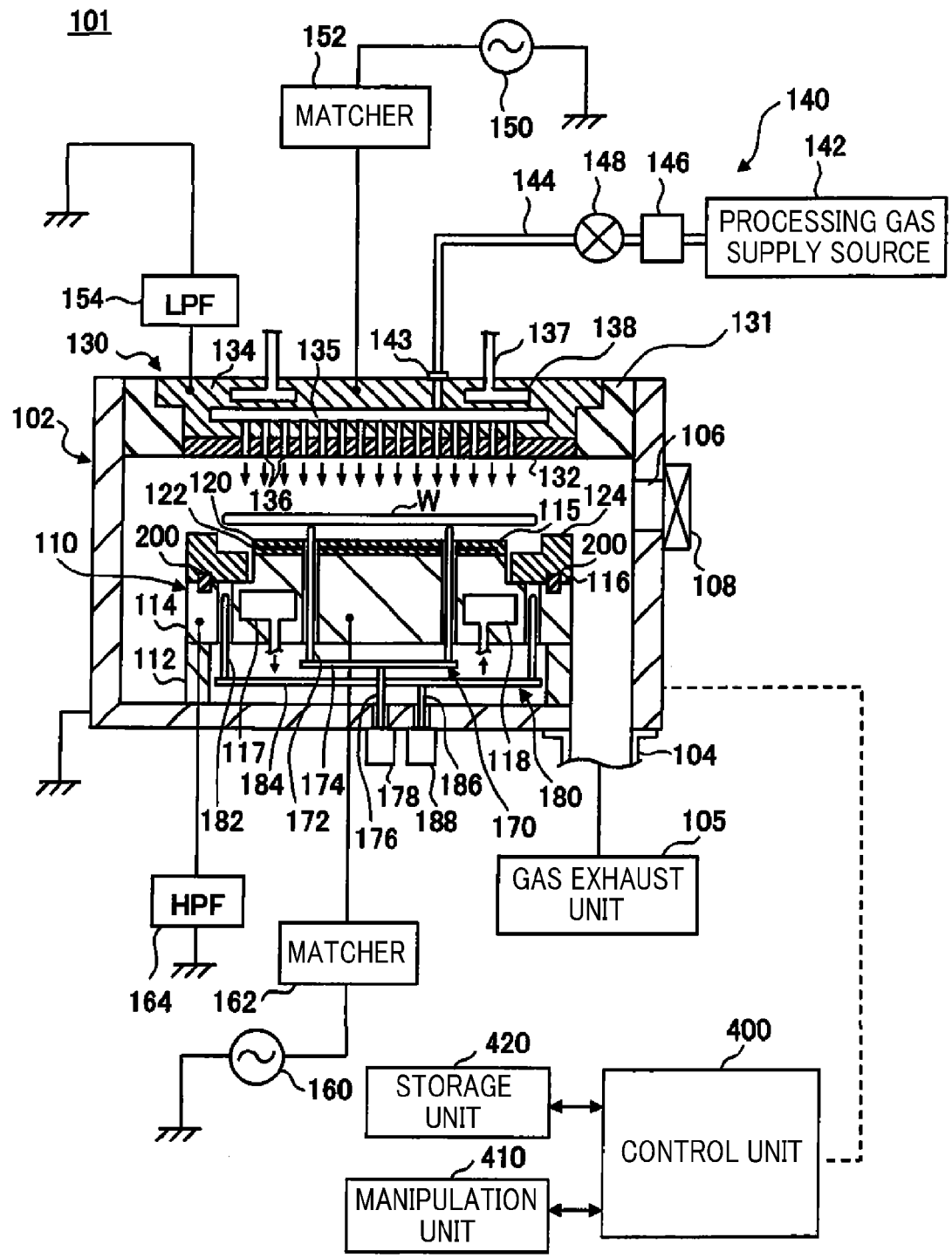
FIG. 12 is a longitudinal cross sectional view illustrating a schematic configuration of a plasma processing apparatus in accordance with a second embodiment of the present disclosure.
Figure 13:
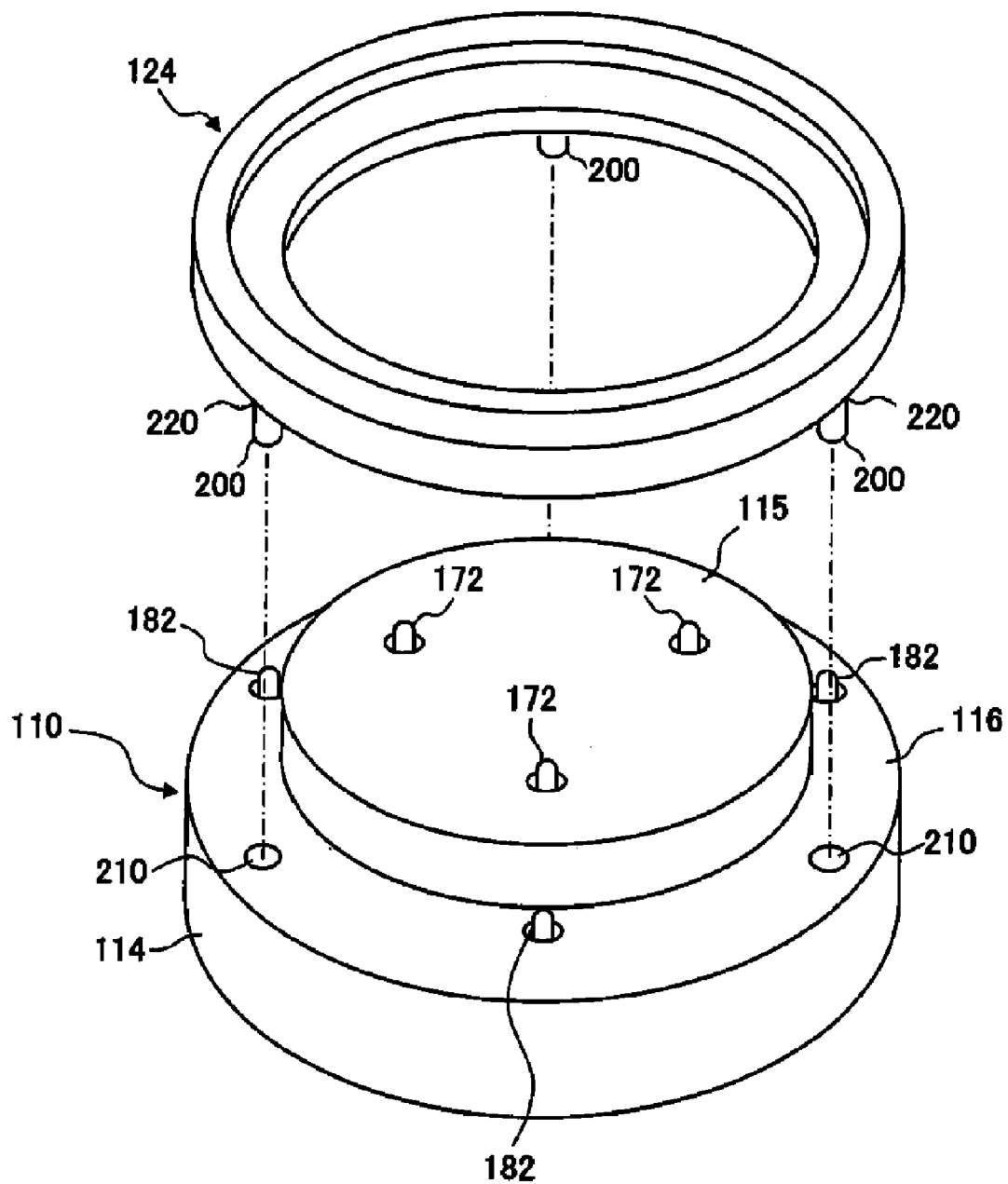
FIG. 13 is a perspective view illustrating a configuration of a susceptor shown in FIG. 12.

Hereinafter, a configuration example of a substrate processing apparatus in accordance with a second embodiment of the present disclosure will be described with reference to the accompanying drawings. Here, the description will be provided for a case of automatically installing and positioning a focus ring 124 by using the same positioning pins 200 as used in the first embodiment in a substrate processing apparatus including a single parallel plate type plasma processing apparatus and a transfer arm capable of loading and unloading a wafer W and the focus ring 124 to/from a processing chamber of the plasma processing apparatus. FIG. 12 is a longitudinal cross sectional view illustrating a configuration example of a plasma processing apparatus 101 in accordance with the second embodiment. FIG. 13 is a perspective view illustrating a configuration of a susceptor 114 shown in FIG. 12.

The plasma processing apparatus 101 illustrated in FIG. 12 is a parallel plate type plasma processing apparatus, the same as in FIG. 1. Further, parts of the plasma processing apparatus 101 having substantially same function and configuration as those of the plasma processing apparatus 100 shown in FIG. 1 will be assigned same reference numerals, and redundant description will be omitted.

In the present embodiment, the focus ring 124 equipped with positioning pins 200 is installed and positioned, as depicted in FIG. 13. That is, the positioning pins 200 are previously inserted in positioning holes (second reference holes) 220 formed in the focus ring 124 so as to be protruded outward from a bottom surface of the focus ring 124. In this case, for example, the positioning pins 200 may be inserted into the positioning holes 220 of the focus ring 124 so as to be fixed therein. Alternatively, the positioning pins 200 may be inserted into the positioning holes 220 in a movable state and then heated and expanded so as to be fitted into the positioning holes 220. Still alternatively, the positioning pins 200 may be adhered and fixed to the positioning holes 220.

As illustrated in FIG. 13, on a mounting table 110 of the plasma processing apparatus 101, a focus ring mounting surface 116 of the susceptor 114 is provided with positioning holes (first reference holes) 210 each having a diameter allowing a positioning pin 200 before expanded to be inserted therein in a movable state, as in the first embodiment. If the focus ring 124 is mounted on the focus ring mounting surface 116, the positioning pins 200 are inserted into the positioning holes 210. Then, the positioning pins 200 are heated and expanded to be fitted into the positioning holes 210, so that the focus ring 124 can be positioned accurately. Further, an effect of this operation will be described later.

Further, as illustrated in FIG. 13, the susceptor 114 of the plasma processing apparatus 101 is provided with first lifter pins 172 configured to be protrusible above and retractable below a substrate mounting surface 115 and second lifter pins 182 configured to be protrusible and retractable from the focus ring mounting surface 116. To be specific, as shown in FIG. 12, the first lifter pins 172 are driven by a first lifter 170 and are capable of separating a wafer W from the substrate mounting surface 115 by lifting the wafer W upward. Further, the second lifter pins 182 are driven by a second lifter 180 and are capable of separating the focus ring 124 from the focus ring mounting surface 116 by lifting the focus ring 124 upward.

The first lifter 170 includes a base 174 supporting a plurality of (e.g., three) first lifter pins 172 in upright positions; and a motor 178 which moves a rod 176 such as a ball screw fixed to the base 174 up and down. The second lifter 180 includes a base 184 supporting a plurality of (e.g., three) second lifter pins 182 in upright positions; and a motor 188 which moves a rod 186 such as a ball screw fixed to the base 184 up and down.

For example, a DC motor or a step motor may be used as the motors 178 and 188. However, an elevating mechanism for the first lifter 170 and the second lifter 180 is not limited thereto. By way of example, a linear motor may be used as an elevating mechanism.

In the plasma processing apparatus 101, an insulator 112 surrounding the susceptor 114 is formed in a ring shape, and the first lifter pins 172 are extended vertically upward from a lower portion of the susceptor 114 surrounded by the insulator 112 so as to be protrusible above and retractable below the substrate mounting surface 115 which is a top surface of an electrostatic chuck 120. To elaborate, each of the first lifter pins 172 is inserted into a hole formed through the susceptor 114 and the electrostatic chuck 120 and is protruded above and retracted below the substrate mounting surface 115 by an elevation operation of the base 174, as illustrated in FIG. 13. The base 174 is formed in, e.g., a ring shape, and the first lifter pins 172 are arranged on top of the base 174 while spaced apart from each other at a substantially same distance. Further, the number of the first lifter pins 172 is not limited to three.

The second lifter pins 182 are extended vertically upward from a lower portion of the susceptor 114 so as to protrusible above and retractable below the focus ring mounting surface 116. To be specific, each of the second lifter pins 182 is inserted into a hole formed through the susceptor 114 and the focus ring mounting surface 116 and is protruded above and retracted below the focus ring mounting surface 116 by an elevation operation of the base 184, as illustrated in FIG. 13. The base 184 is formed in, e.g., a ring shape, and the second lifter pins 182 are arranged on top of the base 184 while spaced apart from each other at a substantially same distance. Here, the number of the second lifter pins 182 is not limited to three.

The base 184 of the second lifter 180 has a larger diameter than that of the base 174 of the first lifter 170 and is positioned outside the base 174. With this configuration, the second lifter 180 can be elevated up and down independently of the first lifter 170 without interrupting each other.

In accordance with the first lifter 170 configured as described above, the wafer W can be lifted up and separated from the electrostatic chuck 120 by lifting the first lifer pins 172 by the base 174. Further, In accordance with the second lifter 180, the focus ring 124 can be lifted up and separated from the focus ring mounting surface 116 by lifting the second lifer pins 182 by the base 184.

Figure 14A:
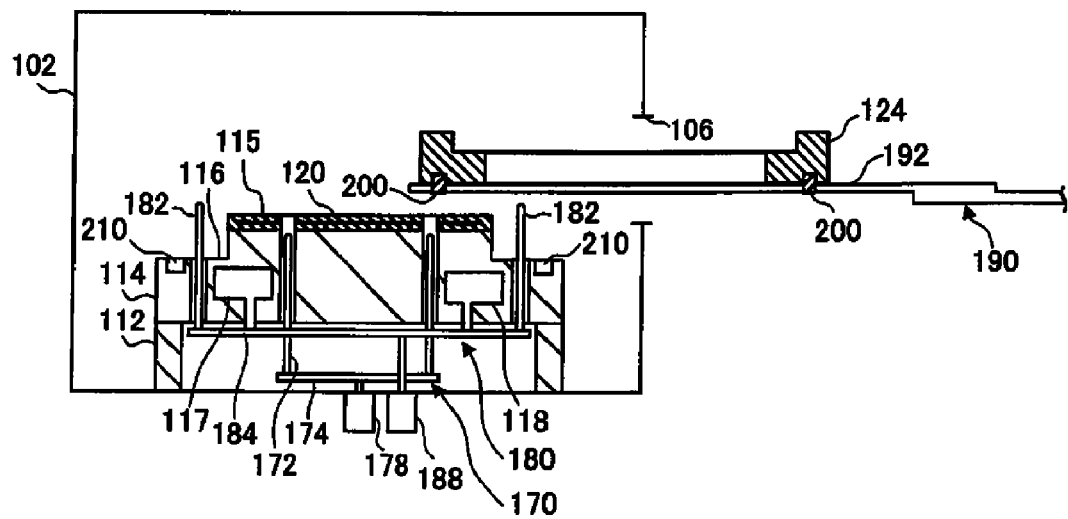
FIG. 14A is a schematic diagram for describing an operation of installing a focus ring shown in FIG. 12, and it shows a state during loading of the focus ring.

As shown in FIG. 14A, the focus ring 124 can be loaded and unloaded through a loading/unloading port 106 by a transfer arm 190 provided outside a processing chamber 102. Here, the transfer arm 190 has a pick 192 capable of transferring the focus ring 124 as well as the wafer W.

Figure 15A:
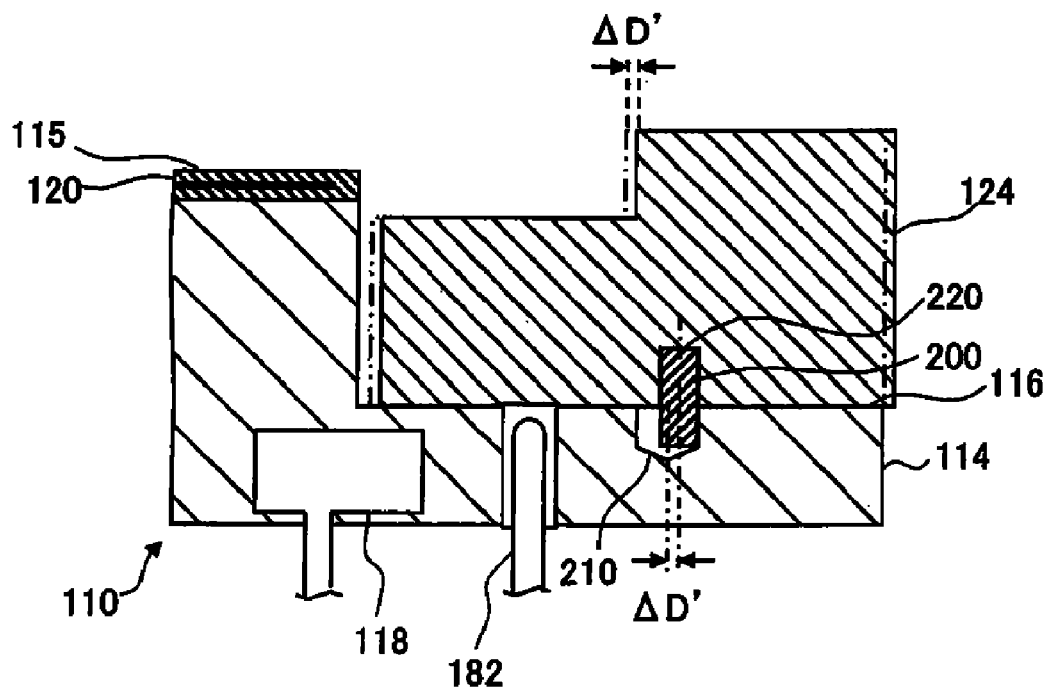
FIG. 15A is a schematic diagram for describing an operation of positioning the focus ring shown in FIG. 12, and it shows a state before a positioning pin is heated.
Figure 15B:
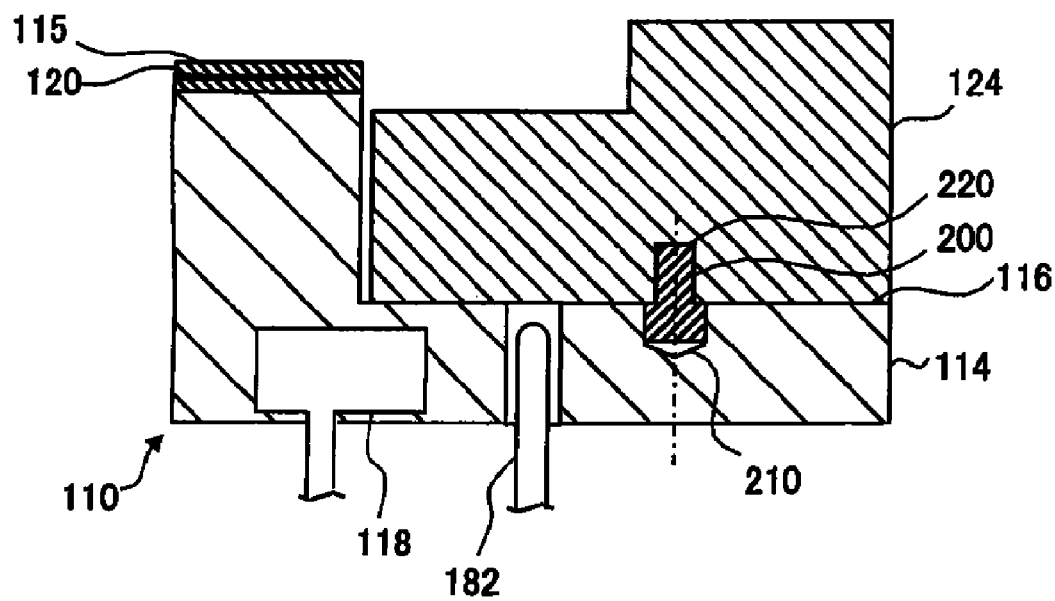
FIG. 15B is a schematic diagram for describing an operation of positioning the focus ring shown in FIG. 12, and it shows a state after the positioning pin is heated.
Figure 16A:
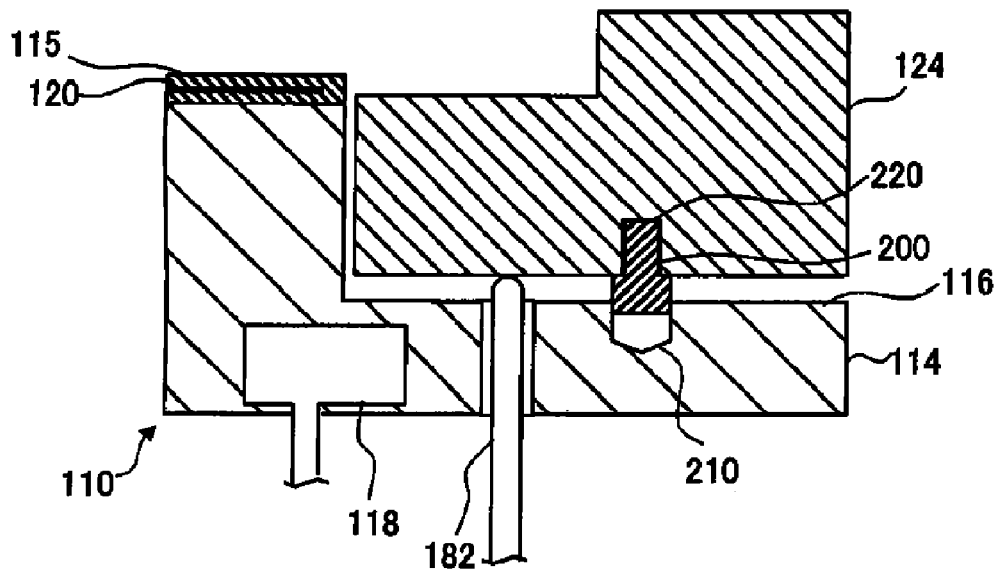
FIG. 16A is a schematic diagram for describing an operation of unloading the focus ring shown in FIG. 12, and it shows a state during lifting of the focus ring by the second lifter pin.
Figure 16B:
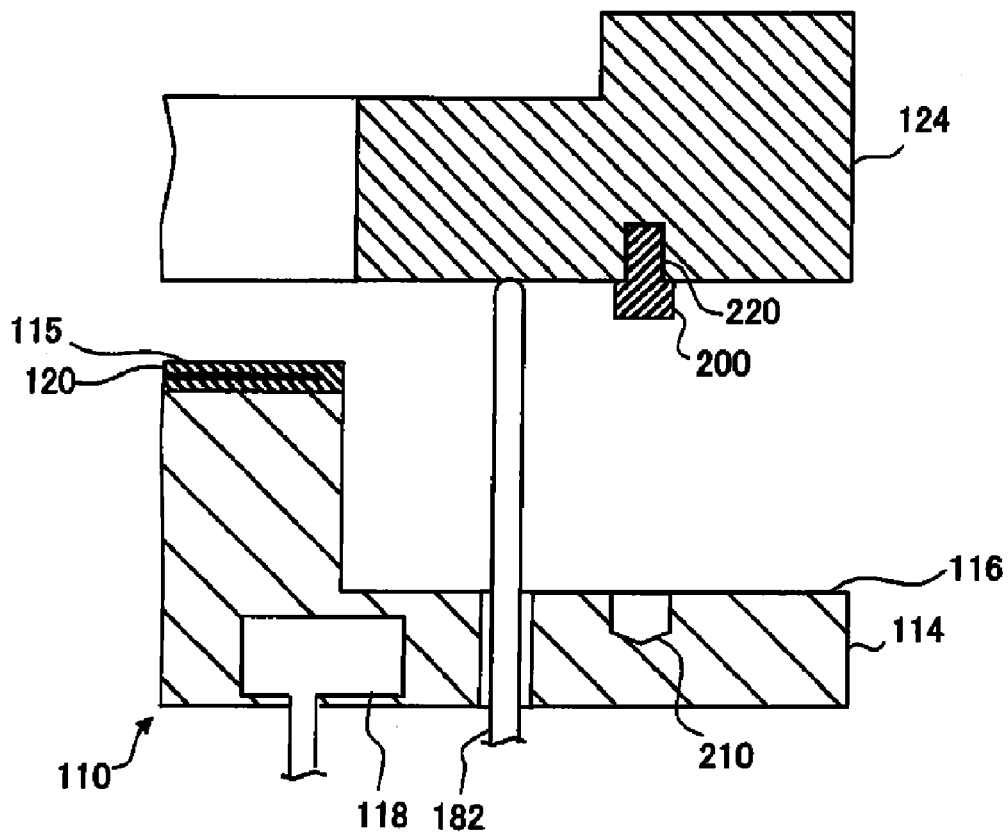
FIG. 16B is a schematic diagram for describing an operation of unloading the focus ring shown in FIG. 12, and it shows a state after the focus ring is lifted by the second lifter pin.

Hereinafter, an operation of the substrate processing apparatus in accordance with the second embodiment will be explained with reference to the accompanying drawings. FIGS. 14A to 14D are longitudinal cross sectional views for describing an operation of installing the focus ring 124 on the focus ring mounting surface 116 of the susceptor 114. FIGS. 15A and 15B are enlarged cross sectional views for describing an operation of positioning the focus ring 124. FIGS. 16A and 16B are enlarged cross sectional views for describing an operation of lifting up the focus ring 124 and separating it from the focus ring mounting surface 116.

First, the operation of installing the focus ring 124 on the focus ring mounting surface 116 will be explained with reference to FIGS. 14A to 14D. In this case, before the focus ring 124 is loaded, the second lifter pins 182 are lifted up to a preset focus ring receiving position (a position where top ends of the second lifter pins 182 are protruded higher than the substrate mounting surface 115) by driving the second lifter 180.

Figure 14B:
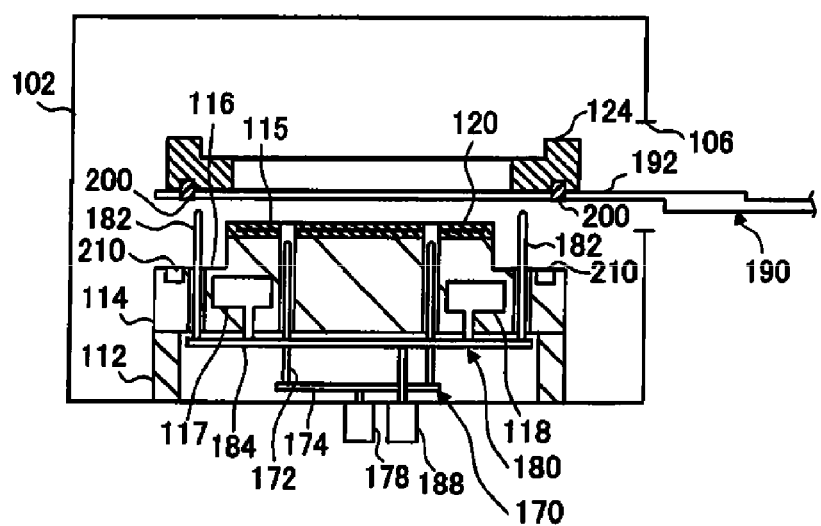
FIG. 14B is a schematic diagram for describing an operation of installing the focus ring shown in FIG. 12, and it shows a state before the focus ring is transferred onto a second lifter pin.
Figure 14C:
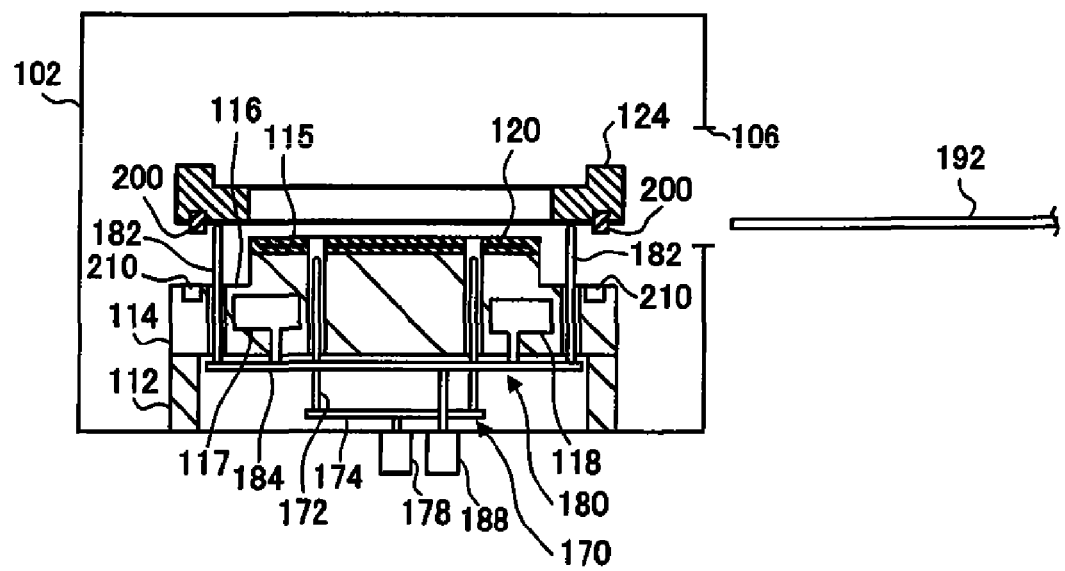
FIG. 14C is a schematic diagram for describing an operation of installing the focus ring shown in FIG. 12, and it shows a state after the focus ring is transferred onto the second lifter pin.

Then, as depicted in FIGS. 14A to 14B, the focus ring 124 equipped with the positioning pins 200 is mounted on the pick 192 of the transfer arm 190 and loaded through the loading/unloading port 106. Subsequently, as shown in FIG. 14C, the focus ring 124 is transferred onto the second lifter pins 182, and the pick 192 is retreated out of the processing chamber 102.

Figure 14D:
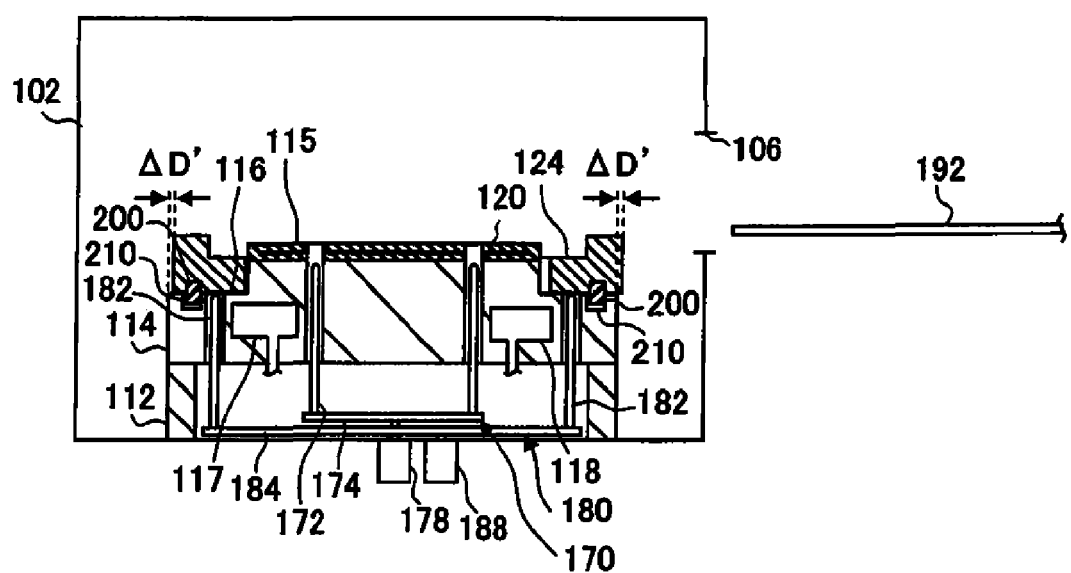
FIG. 14D is a schematic diagram for describing an operation of installing the focus ring shown in FIG. 12, and it shows a state after the focus ring is lowered onto the second lifter pin.

Thereafter, the second lifter 180 is driven, and the focus ring 124 is lowered by the lifter pins 182. Thus, as illustrated in FIG. 14D, the positioning pins 200 are inserted into the positioning holes 210 in the focus ring mounting surface 116, and the focus ring 124 is placed on the focus ring mounting surface 116.

Here, the focus ring 124 may be installed in a slightly deviated position from the susceptor 114. The degree of such a position deviation of the focus ring 124 may vary depending on transfer accuracy of the transfer arm 190 or the like. In this embodiment, assume that the focus ring 124 is deviated by ΔD'.

Hereinafter, an operation of accurately positioning the focus ring 124 installed as stated above will be explained with reference to FIGS. 15A and 15B. FIG. 15A provides a partial enlarged view showing the state of FIG. 14D. As illustrated in FIG. 15A, although the positioning pin 200 is inserted into the positioning hole 210 when the focus ring 124 is installed, a center of the positioning hole 210 is deviated from a center of the positioning hole 220 in the focusing ring 124 by ΔD'.

Then, the positioning pin 200 is heated to a temperature equal to or higher than a preset temperature. In the plasma processing apparatus 101 illustrated in FIG. 12, a susceptor temperature controller 117 controls a temperature of the susceptor 114 to be equal to or higher than the preset temperature, thereby heating the positioning pin 200. Here, the preset temperature may be equal to or higher than a temperature at which the positioning pins 200 are expanded in a diametric direction. Thus, the required temperature varies depending on a material of the positioning pins 200. For example, if the positioning pin 200 is made of PPS resin, it is heated to, e.g., about 80° C. or higher.

As a result, as shown in FIG. 15B, the positioning pin 200 is expanded in the diametric direction so as to fill up a gap within the positioning hole 220 in the diametric direction, and, thus, the position deviation (ΔD' as shown in FIG. 15A) between the centers of the positioning holes 210 and 220 is removed, so that the centers of the positioning holes 210 and 220 can be aligned on a substantially same line. In this way, the focus ring 124 can be accurately positioned at a preset position on the susceptor 114 without deviation.

For this reason, even if a position of the focus ring 124 is deviated due to poor transfer accuracy of the transfer arm 190 when the focus ring 124 is installed, the position of the focus ring 124 can be still accurately aligned by heating the positioning pin 200. According to an experiment conducted by the present inventor, the centers of the positioning holes 210 and 220 can be accurately aligned on the substantially same line within an error range of about 1/100 mm or less.

After the position of the focus ring 124 is aligned in this way, processing of the wafer W is started. To be specific, the wafer W is loaded into the processing chamber 102 by the transfer arm 190 and mounted on the substrate mounting surface 115, and a plasma process is carried out. At this time, since the position of the focus ring 124 is accurately aligned, a gap D between an outer periphery of the wafer W and the focus ring 124 becomes uniform along a circumferential direction. Accordingly, intra-surface uniformity of the plasma process on the wafer W (especially, intra-surface uniformity at a peripheral portion of the wafer W along the circumferential direction) can be improved.

As the above-described plasma process is repetitively performed on the wafer W, a surface of the focus ring 124 is gradually worn out by active species of plasma. For this reason, the focus ring 124 needs to be replaced. At this time, if the positioning pin 200 is left when the focus ring 124 is lifted up by the lifter pin 182, it may be impossible to automatically transfer a new focus ring 124.

In accordance with the positioning pin 200 of the present embodiment, however, since the positioning pin 200 is expanded by heating to fill up the gap of the positioning hole 210, positioning accuracy is improved, but the degree of fitness is not so high. Thus, the positioning pin 200 can also be lifted up together with the focus ring 124 when the focus ring 124 is lifted up by the lifter pins 182 and thus the positioning pin 200 can be easily separated from the positioning hole 210.

Hereinafter, an operation of unloading the focus ring 124 by using the transfer arm 190 will be explained in further detail with reference to FIGS. 16A and 16B. While the focus ring 124 is mounted on the focus ring mounting surface 116, the second lifter pin 182 is lifted upward by driving the second lifter 180. Then, as shown in FIG. 16A, if the second lifter pin 182 raises the focus ring 124, the positioning pin 200 is raised upward together with the focus ring 124 while it is still attached to the focus ring 124. Then, if the second lifter pin 182 is further lifted up, the positioning pin 200 is separated from the positioning hole 210 and raised upward while still attached to the focus ring 124, as depicted in FIG. 16B. In this way, the focus ring 124 still having the positioning pin 200 attached thereto can be received by the transfer arm 190 and can be unloaded from the processing chamber 102.

As described above, in accordance with the second embodiment, the focus ring 124 can be unloaded without leaving the positioning pin 200 in the positioning hole 210. Accordingly, the focus ring 124 can be automatically replaced by the transfer arm 190. That is, after the focus ring 124 is unloaded by the transfer arm 190, a new focus ring 124 having a positioning pin 200 before heating can be loaded and installed. Moreover, by heating the positioning pin 200, accurate positioning of the new focus ring 124 can be carried out automatically.

Accordingly, it is possible for an operator to replace the focus ring 124 without opening a cover of the processing chamber 102 (without opening the processing chamber 102 to the atmosphere). For this reason, if the transfer arm 190 is installed in a depressurized room connected with the processing chamber 102, the focus ring 124 can be replaced under the depressurized atmosphere, and, further, accurate positioning of the focus ring 124 can be achieved by the positioning pin 200.

Figure 17:
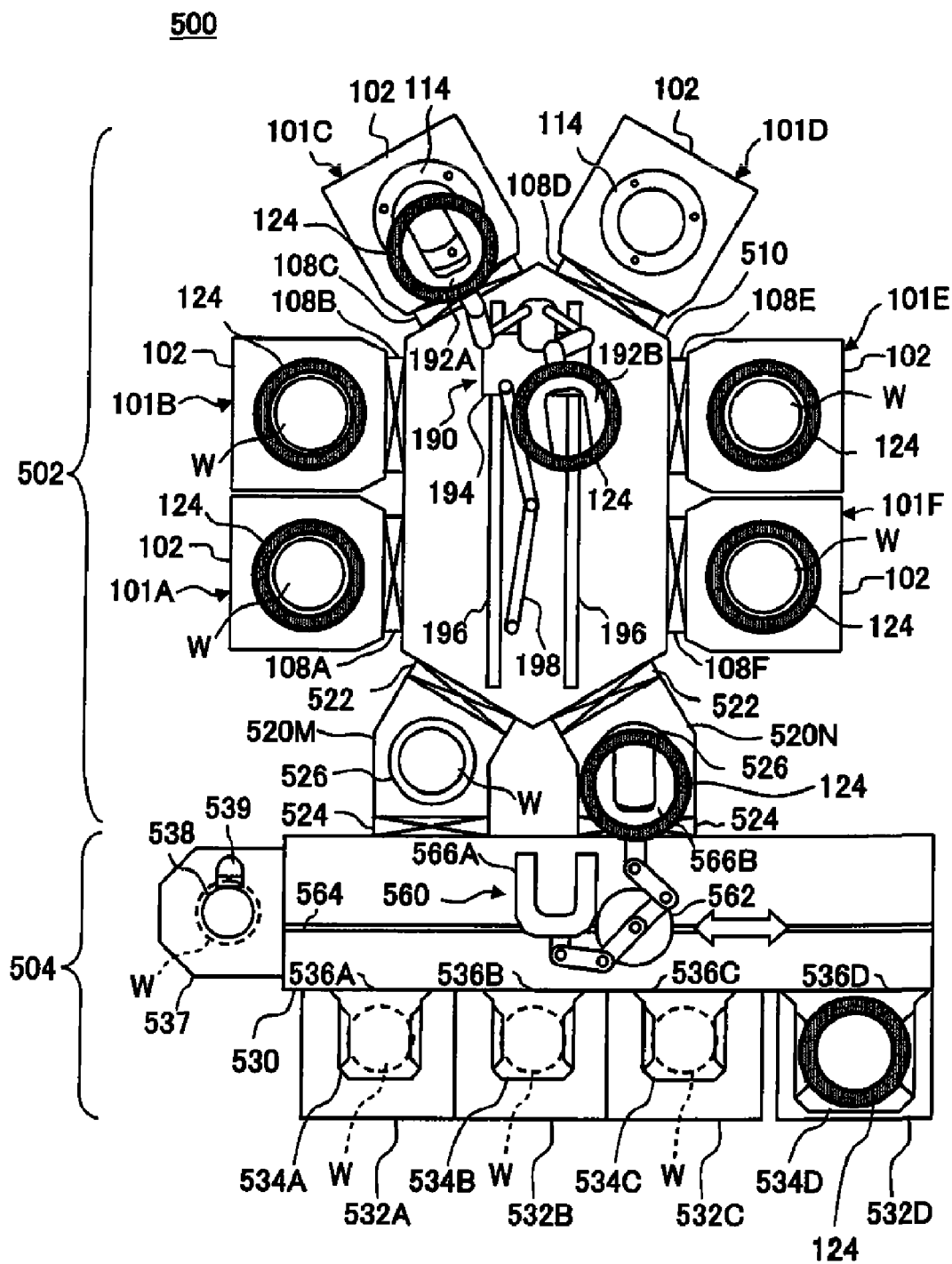
FIG. 17 is a transversal cross sectional view illustrating a configuration example of a substrate processing apparatus in accordance with a third embodiment of the present disclosure.

Configuration Example of a Substrate Processing Apparatus in Accordance with a Third Embodiment Hereinafter, a configuration example of a substrate processing apparatus in accordance with a third embodiment of the present disclosure will be explained with reference to the accompanying drawings. Here, the description will be provided for a substrate processing apparatus 500 of a cluster tool type in which a plurality of plasma processing apparatuses 101A to 101F of the second embodiment are connected to an evacuable common transfer chamber 510. FIG. 17 is a transversal cross sectional view showing a configuration example of the substrate processing apparatus 500 in accordance with the third embodiment.

As depicted in FIG. 17, the substrate processing apparatus 500 includes a vacuum processing unit 502; and a transfer unit 504 which loads and unloads the wafer W into/from the vacuum processing unit 502. The vacuum processing unit 502 includes a multiple number of (e.g., six) plasma processing apparatuses 101A to 101F connected to a common transfer chamber 510 via gate valves 108A to 108F, respectively. The common transfer chamber 510 is configured to be evacuable to a preset vacuum pressure, and the above-described transfer arm 190 is installed within the common transfer chamber 510. With this configuration, the wafer W and the focus ring 124 can be loaded and unloaded between the plasma processing apparatuses 101A to 101F under a depressurized atmosphere.

The transfer arm 190 includes two picks 192A and 192B and is capable of handling two wafers W or two focus rings 124 at the same time. The transfer arm 190 is rotatably supported on a base 194. The base 194 is configured to be slid by, e.g., a non-illustrated slide driving motor on a guide rail 196 extended from a rear side to a front side within the common transfer chamber 510. Further, the base 194 is connected with a flexible arm 198 for allowing wiring for an arm revolving motor or the like to pass therethrough.

Further, although FIG. 17 illustrates that the substrate processing apparatus 500 includes six plasma processing apparatuses 101A to 101F, the present disclosure is not limited thereto. The substrate processing apparatus 500 may include only five or less ones among the plasma processing apparatuses 101A to 101F. Furthermore, in the substrate processing apparatus 500 shown in FIG. 17, at least one of the plasma processing apparatuses 101A to 101F may need replacement of the focus ring 124, and, the rest processing apparatuses may be a heat treatment apparatus, a film forming apparatus, or the like.

The common transfer chamber 510 is connected with one sides of first and second load lock chambers 520M and 520N via respective gate valves (vacuum pressure side gate valves) 522. The other sides of the first and second load lock chambers 520M and 520N are connected with a transfer chamber 530 of the transfer unit 504 via respective gate valves (atmospheric pressure side gate valves) 524.

The first and second load lock chambers 520M and 520N temporarily accommodate therein the wafer W or the focus ring 124; pass them to the common transfer chamber 510 after controlling its inside to a depressurized atmosphere; and pass them to the transfer chamber 530 of the transfer unit 504 after controlling its inside to an atmospheric atmosphere. In each of the first and second load lock chambers 520M and 520N, a transfer table 526 capable of mounting the wafer W or the focus ring 124 thereon is provided.

In the vacuum processing unit 502 configured as described above, the transfer arm 190 can be slid along the guide rail 196 and access the first and second load lock chambers 520M and 520N and processing chambers 102 of the respective plasma processing apparatuses 101A to 101F. For example, when the transfer arm 190 is made to access the first or second load lock chamber 520M or 520N or a processing chamber 102 of the plasma processing apparatus 101A or 101F, the transfer arm 190 is moved to the rear side of the common transfer chamber 510 along the guide rail 196.

Meanwhile, when the transfer arm 190 is made to access a processing chamber 102 of the plasma processing apparatuses 101B to 101E, the transfer arm 190 is moved to the front side of the common transfer chamber 510 along the guide rail 196. In this way, the single transfer arm 190 can access all the processing chambers 102 connected with the common transfer chamber 510 and the first and second load lock chambers 520M and 520N.

Although the above-described embodiment illustrates that only one transfer arm 190 is slidably installed, the present disclosure is not limited thereto. By way of example, two transfer arms 190 may be rotatably fixed at the rear side and the front side of the common transfer chamber 510, respectively. Further, the number of the picks of the transfer arm 190 is not limited to two but may be, e.g., one.

Now, a configuration example of the transfer unit 504 will be explained. The transfer unit 504 includes the transfer chamber 530 of a box shape. The inside of the transfer chamber 530 is under an atmospheric atmosphere, and clean air or an inactive gas such as a $N_2$ gas is circulated therein. The transfer chamber 530 is provided with an array of a plurality of cassette stages 532A to 532D. Cassette containers 534A to 534C for accommodating therein wafers W are set on these cassette stages 532A to 532C. Three load ports 536A to 536C each serving as an input port of a wafer W are provided at a sidewall of the transfer chamber 530 so as to correspond to the cassette stages 532A to 532C, respectively.

Although FIG. 17 illustrates the three cassette containers 534A to 534C mounted on the three cassette stages 532A to 532C respectively, the number of the cassette stages and the cassette containers is not limited thereto. For example, one or two of them may be provided, or four or more may be provided.

Each of the cassette containers 534A to 534C is configured to accommodate therein at least one lot (e.g., twenty five sheets) of wafers W in multi-levels at a same pitch, and the inside of each container is hermetically sealed while filled with, e.g., a N2 gas atmosphere.

Meanwhile, set on the cassette stage 532D is a cassette container 534D for accommodating therein a focus ring 124. Furthermore, a load port 536D serving as an input port of the focus ring 124 is installed so as to correspond to the cassette stage 532D. The cassette container 534D accommodates therein the focus ring 124 having positioning pins 200 before heating. In this case, a position of the focus ring 124 in the circumferential direction is tentatively determined such that each positioning pin 200 is inserted into corresponding one of a plurality of positioning holes 210 formed in a focus ring mounting surface 116 when the focus ring 124 is loaded into each of the plasma processing apparatuses 101A to 101F.

An orienter (a pre-alignment stage) 537 serving as a positioning device for the wafer W is provided at the transfer chamber 530. The orienter 537 includes, e.g., a rotary mounting table 538 and an optical sensor 539 that optically detects a peripheral portion of the wafer W. The orienter 537 performs position alignment of the wafer W by detecting an orientation flat or a notch of the wafer W.

Installed in the transfer chamber 530 is a transfer arm 560 that loads and unloads the wafer W or the focus ring 124 into/from each of the cassette containers 534A to 534D, the orienter 537, and the first and second load lock chambers 520M and 520N. The transfer arm 560 is fixed on a base 562, and the base 562 is configured to be slid by, e.g., a linear motor driving mechanism along a guide rail 564 installed in a lengthwise direction within the transfer chamber 530. For example, the transfer arm 560 may be a double arm mechanism having two picks 566A and 566B as shown in FIG. 17 or a single arm mechanism having a single pick.

In the substrate processing apparatus 500 configured as discussed above, a wafer W is unloaded from one of the cassette containers 534A to 534C and transferred into one of the plasma processing apparatuses 101A to 101F, and a plasma process such as etching can be performed on the wafer W. By way of example, when a plasma process is performed on a wafer W of the cassette container 534A in the plasma processing apparatus 101A, the wafer W is first transferred from the cassette container 534A into the transfer chamber 530 by the transfer arm 560 and then transferred to the orienter 537 to be aligned therein. Then, the wafer W is unloaded from the orienter 537 and loaded into the load lock chamber 520N under an atmospheric atmosphere by the transfer arm 560.

Subsequently, after the inside of the load lock chamber 520N is controlled to be under a depressurized atmosphere, the wafer W is unloaded therefrom and transferred into the common transfer chamber 510 and then loaded into the processing chamber 102 of the plasma processing apparatus 101A by the transfer arm 190. Thereafter, a plasma process is performed on the wafer W in the plasma processing apparatus 101A.

After the plasma process in the plasma processing apparatus 101A is completed, the processed wafer W is unloaded from the processing chamber 102 and loaded into the load lock chamber 520M under a depressurized atmosphere by the transfer arm 190. Then, if the inside of the load lock chamber 520N is changed to an atmospheric atmosphere, the wafer W is unloaded and returned back into the original cassette container 534A by the transfer arm 560.

Meanwhile, when the focus ring 124 needs to be replaced, the focus ring 124 is transferred in the substantially same manner as the wafer W. For example, when the focus ring 124 of the plasma processing apparatus 101C needs to be replaced, a new focus ring 124 is unloaded from the cassette container 534D and loaded into the load lock chamber 520M by the transfer arm 560. Then, after the internal pressure of the load lock chamber 520M is controlled, the new focus ring 124 is unloaded from the load lock chamber 520M by one pick 192A of the transfer arm 190 and moved to the front of the plasma processing apparatus 101C by a slide movement of the transfer arm 190.

At this time, in the plasma processing apparatus 101C, as discussed earlier with reference to FIGS. 16A and 16B, the used focus ring 124 having the positioning pins 200 is raised upward by the second lifter pins 182.

Thereafter, the other pick 192B of the transfer arm 190 receives the used focus ring 124 from the second lifter pins 182 and unloads it from the plasma processing apparatus 101C. At this time, the used focus ring 124 is unloaded from the plasma processing apparatus 101C while the positioning pins 200 are still attached to the focus ring 124. Subsequently, the new focus ring 124 is transferred onto the second lifter pins 182 by the pick 192A. Meanwhile, the used focus ring 124 is returned back into the original cassette container 534D via the load lock chamber 520M.

If the new focus ring 124 is loaded into the plasma processing apparatus 101C, the new focus ring 124 is lowered down by the second lifter pins 182, and, thus, each of the positioning pins 200 is inserted into its corresponding one of positioning holes 210, as described earlier with reference to FIGS. 14B to 14D, and the new focus ring 124 is mounted on the focus ring mounting surface 116.

In this case, since the focus ring 124 is transferred by the multiple transfer arms 190 and 560 via, e.g., the load lock chamber 520M, a transfer error may be easily made. Accordingly, if the focus ring 124 is transferred and installed without position alignment, a position of the focus ring 124 may be deviated as illustrated in FIG. 15A.

In the present embodiment, however, even if the position is deviated due to the transfer error, the position of the new focus ring 124 can be accurately aligned by heating and expanding each of the positioning pins 200, as described earlier with reference to FIGS. 15A and 15B.

Further, in the third embodiment, although the focus ring 124 is accommodated in the cassette container 534D, the present disclosure is not limited thereto. Since the replacement of the focus ring 124 is not carried out frequently as many as the transfer of the wafer W, a mounting unit (not shown) for mounting thereon one or multiple sheets of focus rings 124 may be installed in the orienter 537 instead of accommodating the focus ring 124 in the cassette container 534D. In this case, the focus ring 124 may be set on the mounting unit of the orienter 537 and unloaded from the mounting unit and transferred into one of the plasma processing apparatuses 101A to 101F by the transfer arm 560.

Figure 18:
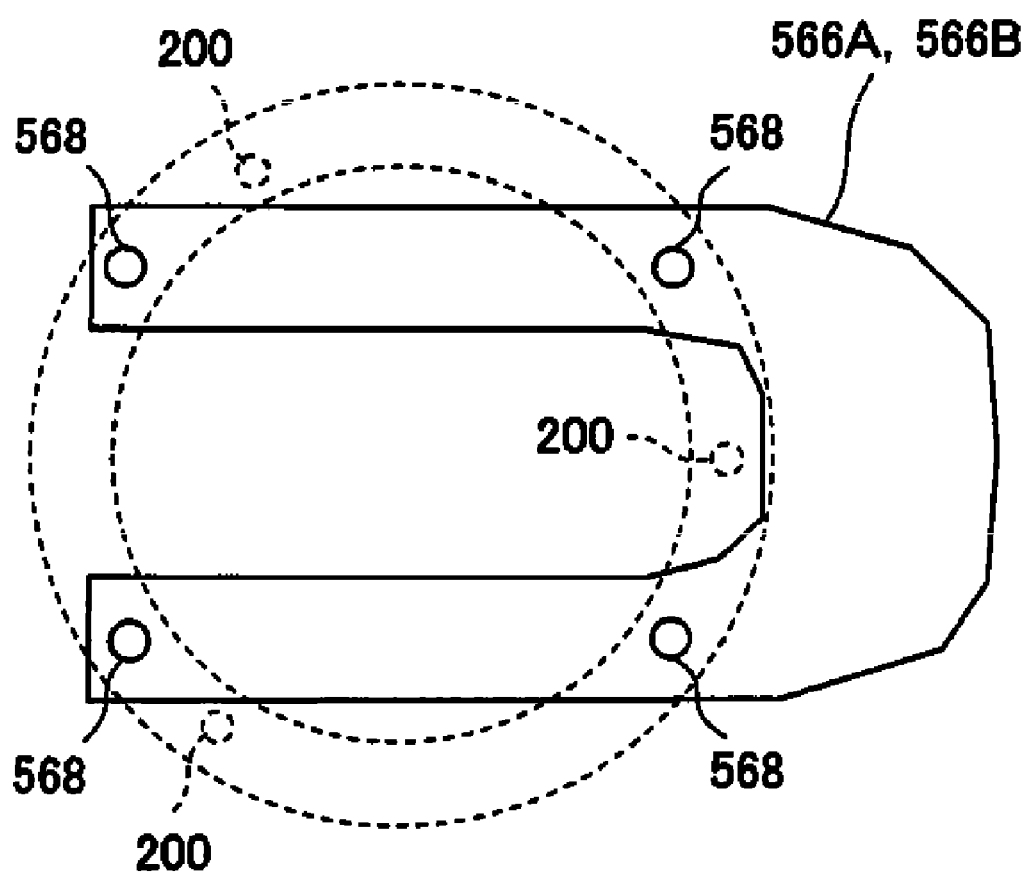
FIG. 18 shows a modification example of a pick of a transfer arm installed in a transfer chamber shown in FIG. 17.

If the replacement of the focus ring 124 is required, the operator may manually mount the focus ring 124 on one of the picks 566A and 566B of the transfer arm 560. In this case, as depicted in FIG. 18, a plurality of protrusions 568 for tentative positioning may be formed on the picks 566A and 566B. Although four protrusions 568 for tentative positioning are illustrated in FIG. 18, the present disclosure is not limited thereto. That is, at least two protrusions may be sufficient, and three protrusions may be possible.

Recesses (not shown) for accommodating the protrusions 568 are formed in a bottom surface of the focus ring 124. Further, when the focus ring 124 is replaced, the new focus ring 124 is mounted on the pick 566A or 566B such that recesses of the new focus ring 124 are positioned to accommodate therein the protrusions 568 for tentative positioning appropriately. A position of the focus ring 124 in the circumferential direction is tentatively determined by the protrusions 568 for tentative positioning such that each of the positioning pins 200 can be inserted into corresponding one of the positioning holes 210 formed in the focus ring mounting surface 116 when the focus ring 124 is loaded into one of the plasma processing apparatuses 101A to 101F.

Although the embodiments of the present disclosure have been described with reference to the relevant drawings, the present disclosure is not limited to the above-stated embodiments. It would be understood by those skilled in the art that various changes and modifications may be made within the scope as defined in the following claims.

By way of example, in the above-described embodiments, although high frequency powers are applied to both the upper electrode and the lower electrode, a high frequency may be applied only to the upper electrode. Further, although a high frequency in the range from about 27 MHz to about 150 MHz is applied to the upper electrode, the frequency range is not limited thereto. Furthermore, although the wafer W is used as a substrate on which the etching process is to be performed, the substrate is not limited to the wafer, and other types of substrates such as a FPD substrate and a solar cell substrate may be used. Moreover, the plasma process is not limited to the etching process, and it may be sputtering, CVD, or the like.

INDUSTRIAL APPLICABILITY

The present disclosure has many advantages when it is applied to a substrate processing apparatus that processes a substrate such as a semiconductor wafer, a FPD substrate, or a solar cell substrate. Further, the present disclosure is also applicable to a positioning method and a focus ring installation method.

What is claimed is:

1. A method for positioning a focus ring in a substrate processing apparatus that performs a plasma process on a substrate mounted on a mounting table in a processing chamber and surrounded by the focus ring,
wherein the mounting table includes:
a susceptor having a substrate mounting surface on which the substrate is mounted and a focus ring mounting surface on which the focus ring is mounted, and
a plurality of positioning pins made of a material expandable in a diametric direction by heating, each positioning pin being inserted into a positioning hole formed in the focus ring mounting surface of the susceptor and into a positioning hole formed in the focus ring, and
the method comprises:
heating each positioning pin and allowing the positioning pin to be expanded so as to fill a gap within the positioning holes in a diametric direction and to be fitted into the positioning holes; and
allowing centers of the positioning holes to be aligned on a substantially same line, and thus allowing the focus ring to be positioned at a preset position with respect to the susceptor.

2. The method of claim 1, wherein the mounting table includes a susceptor temperature controller that controls a temperature of the susceptor, and
the positioning pins are expanded by heat applied from plasma or by being heated by the susceptor temperature controller, thus allowing a position of the focus ring to be aligned.

3. The method of claim 2, further comprising:
determining whether or not the positioning pins are required to be heated by the susceptor temperature controller based on a processing condition of the plasma process;
performing the plasma process after positioning the focus ring by heating the positioning pins by the susceptor temperature controller if it is determined that heating by the susceptor temperature controller is required; and
performing the plasma process if it is determined that the heating by the susceptor temperature controller is not required and positioning the focus ring by heating the positioning pins by heat applied from the plasma.

4. A method for positioning an electrode plate of a plasma processing apparatus that performs a process on a substrate mounted on a mounting table by plasma generated by applying a high frequency power to an electrode plate provided on an upper electrode facing the mounting table,
wherein the upper electrode includes:
an electrode support that supports the electrode plate, and
a plurality of positioning pins made of a material expandable in a diametric direction by heating, each positioning pin being inserted into a positioning hole formed in the electrode support and into a positioning hole formed in the electrode plate, and
the method comprises:
heating each positioning pin and allowing the positioning pin to be expanded so as to fill a gap within the positioning holes in a diametric direction and to be fitted into the positioning holes; and
allowing centers of the positioning holes to be aligned on a substantially same line, and thus allowing the electrode plate to be positioned at a preset position with respect to the electrode support.

5. The method of claim 4, wherein the upper electrode includes an electrode support temperature controller that controls a temperature of the electrode support, and
the positioning pins are expanded by heat applied from plasma or by being heated by the electrode support temperature controller, thus allowing a position of the electrode plate to be aligned.

6. The method of claim 5, further comprising:
determining whether or not the positioning pins are required to be heated by the electrode support temperature controller based on a processing condition of the plasma process;
performing the plasma process after positioning the electrode plate by heating the positioning pins by the electrode support temperature controller if it is determined that heating by the electrode support temperature controller is required; and
performing the plasma process if it is determined that the heating by the electrode support temperature controller is not required and positioning the electrode plate by heating the positioning pins by heat applied from the plasma.

7. A method of installing a focus ring so as to surround a substrate accommodated in a processing chamber of a substrate processing apparatus that performs a plasma process on the substrate,
wherein the substrate processing apparatus includes:
a mounting table including a susceptor having a substrate mounting surface on which the substrate is mounted and a focus ring mounting surface on which the focus ring is mounted;
a susceptor temperature controller that controls a temperature of the susceptor;
a plurality of positioning pins made of a material expandable in a diametric direction by heating, each positioning pin being inserted into the focus ring so as to be protruded from a bottom surface thereof and inserted into a positioning hole formed in the focus ring mounting surface of the susceptor;
first lifter pins provided in the mounting table so as to be protruded above or retracted below the substrate mounting surface and configured to lift up the substrate and separate the substrate from the substrate mounting surface;
second lifter pins provided in the mounting table so as to be protruded above or retracted from the focus ring mounting surface and configured to lift up the focus ring together with the positioning pins and separate the focus ring from the focus ring mounting surface; and
a transfer arm provided outside the processing chamber, and configured to exchange the substrate with the first lifter pins via a loading/unloading port provided at the processing chamber, and configured to exchange the focus ring equipped with the positioning pins with the second lifter pins, and
the method comprises:
lifting up the focus ring equipped with the positioning pins by the second lifer pins to replace the focus ring;
receiving the focus ring by the transfer arm and unloading the focus ring to an outside of the processing chamber through the loading/unloading port;

transferring a new focus ring equipped with positioning pins before heating to the second lifter pins by the transfer arm;

lowering the second lifter pins, and allowing the focus ring to be mounted on the focus ring mounting surface while the positioning pins are inserted into the positioning holes; and heating each of the positioning pins by heating the susceptor by the susceptor temperature controller, and allowing each of the positioning pins to be expanded in a diametric direction and aligning a position of the focus ring.

\* \* \* \* \*